(12) United States Patent
Yanagidaira

(10) Patent No.: US 11,996,142 B2
(45) Date of Patent: May 28, 2024

(54) SEMICONDUCTOR STORAGE DEVICE

(71) Applicant: Kioxia Corporation, Tokyo (JP)

(72) Inventor: Kosuke Yanagidaira, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/318,417

(22) Filed: May 16, 2023

(65) Prior Publication Data

US 2023/0290406 A1 Sep. 14, 2023

Related U.S. Application Data

(62) Division of application No. 17/184,980, filed on Feb. 25, 2021, now Pat. No. 11,694,746.

(30) Foreign Application Priority Data

May 19, 2020 (JP) .................................. 2020-087180

(51) Int. Cl.
  *G11C 11/34* (2006.01)
  *G11C 11/56* (2006.01)
  (Continued)

(52) U.S. Cl.
  CPC ...... *G11C 11/5628* (2013.01); *G11C 11/5671* (2013.01); *G11C 16/0483* (2013.01);
  (Continued)

(58) Field of Classification Search
  CPC .................. G11C 16/3459; G11C 16/0483
  See application file for complete search history.

(56) References Cited

U.S. PATENT DOCUMENTS 9,666,296 B1   5/2017 Maejima
2007/0253250 A1* 11/2007 Shibata ............... G11C 16/3459
                                             365/185.03

(Continued)

FOREIGN PATENT DOCUMENTS

JP    2017-157260 A    9/2017

*Primary Examiner* — Uyen Smet
(74) *Attorney, Agent, or Firm* — Kim & Stewart LLP

(57) ABSTRACT

A semiconductor storage device includes a memory transistor and a word line connected to a gate electrode of the memory transistor. When a write sequence is interrupted before a $k+1^{th}$ verification operation is ended after a $k^{th}$ verification operation is ended in the $n^{th}$ write loop of the write sequence, a voltage equal to or higher than a verification voltage corresponding to a first verification operation in the $n^{th}$ write loop is supplied to the word line before start of the $k+1^{th}$ verification operation after resumption of the write sequence. A time from the resumption of the write sequence to the start of the $k+1^{th}$ verification operation is shorter than a time from start of the first verification operation to end of the $k^{th}$ verification operation in the $n^{th}$ write loop.

15 Claims, 30 Drawing Sheets

(51) Int. Cl.
*G11C 16/04* (2006.01)
*G11C 16/10* (2006.01)
*G11C 16/34* (2006.01)
*H01L 25/065* (2023.01)
*H10B 41/27* (2023.01)
*H10B 43/27* (2023.01)

(52) U.S. Cl.
CPC .......... *G11C 16/10* (2013.01); *G11C 16/3459* (2013.01); *H01L 25/0657* (2013.01); *H01L 2225/06506* (2013.01); *H01L 2225/06562* (2013.01); *H10B 41/27* (2023.02); *H10B 43/27* (2023.02)

(56) References Cited

U.S. PATENT DOCUMENTS

| | | | |
|---|---|---|---|
| 2009/0067254 A1* | 3/2009 | Won | G11C 11/5628 365/185.03 |
| 2010/0254193 A1 | 10/2010 | Park | |
| 2021/0257038 A1 | 8/2021 | Hwang | |
| 2021/0343352 A1 | 11/2021 | Cho | |

* cited by examiner

SEMICONDUCTOR STORAGE DEVICE

CROSS-REFERENCE TO RELATED APPLICATION(S)

This application is a divisional of U.S. patent application Ser. No. 17/184,980, filed Feb. 25, 2021, which is based upon and claims the benefit of priority from Japanese Patent Application No. 2020-087180, filed on May 19, 2020, the entire contents of which are incorporated herein by reference.

FIELD

Embodiments described herein relate generally to a semiconductor storage device.

BACKGROUND

A semiconductor storage device includes a substrate, a plurality of gate electrodes stacked in a direction intersecting a front surface of the substrate, a semiconductor layer facing the plurality of gate electrodes, and a gate insulating film formed between the gate electrodes and the semiconductor layer. The gate insulating film includes a charge storage layer of silicon nitride ($Si_3N_4$) or the like or a conductive charge storage layer such as a floating gate.

DESCRIPTION OF THE DRAWINGS

FIG. 17 is a schematic table illustrating the verification operation.

FIG. 29 is a schematic table illustrating interruption and resumption of a write sequence according to an eighth embodiment.

DETAILED DESCRIPTION

Figure 1:
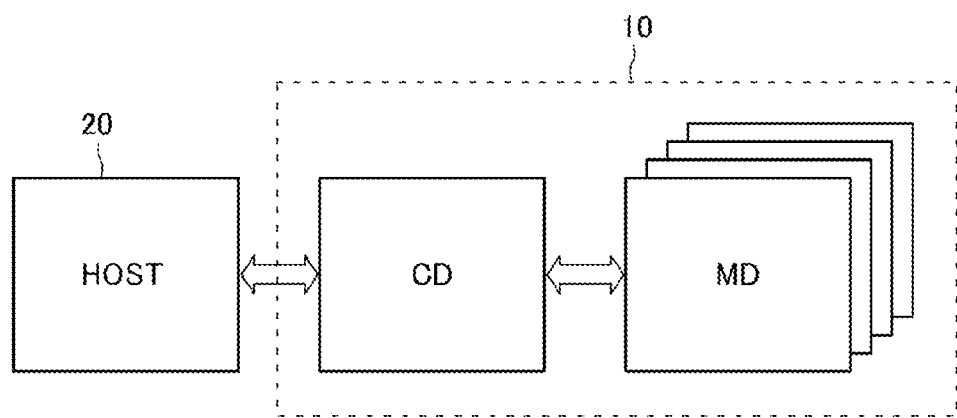
FIG. 1 is a schematic block diagram illustrating the configuration of a memory system according to a first embodiment.

Embodiments provide a semiconductor storage device which is capable of speeding up a write sequence without lowering reliability.

In general, according to one embodiment, a semiconductor storage device includes a memory transistor, and a word line connected to a gate electrode of the memory transistor. The semiconductor storage device is configured to execute a write sequence in which a write loop is executed for the memory transistor multiple times. The write loop includes a program operation of supplying a program voltage to the word line, and at least one verification operation of supplying a verification voltage to the word line. When the write sequence is not interrupted between start and end of the write sequence, in an $n^{th}$ (where n is a natural number) write loop, the program operation is executed once, and the verification operation is executed m (where m is a natural number of 2 or more) times. When the write sequence is interrupted before a $k+1^{th}$ verification operation is ended after a $k^{th}$ verification operation is ended in the $n^{th}$ write loop of the write sequence (where k is a natural number less than m), a voltage equal to or higher than the verification voltage corresponding to a first verification operation in the $n^{th}$ write loop is supplied to the word line before start of the $k+1^{th}$ verification operation after resumption of the write sequence. A time from the resumption of the write sequence to the start of the k+1$^{th}$ verification operation is shorter than a time from a start of the first verification operation in the n$^{th}$ write loop to an end of the k$^{th}$ verification operation in the n$^{th}$ write loop.

Next, a semiconductor storage device according to embodiments will be described in detail with reference to the accompanying drawings. The embodiments to be described herein below are merely examples, and are not intended to limit the scope of the present disclosure. Further, the drawings are schematic, and may omit some components for convenience of description. Further, similar portions in the plurality of embodiments will be denoted by the same reference numerals, and descriptions thereof may be omitted.

Throughout the descriptions herein, the "semiconductor storage device" may indicate a memory die or a memory system that includes a controller die, such as a memory chip, a memory card or an SSD (solid state drive). Alternatively, the "semiconductor storage device" may indicate a configuration that includes a host computer, such as a smart phone, a tablet terminal or a personal computer.

In the descriptions herein, when a first element is "electrically connected" to a second element, the first element may be connected directly to the second element, or the first element may be connected to the second element via a wiring, a semiconductor member or a transistor. For example, when three transistors are connected to each other in series, the first transistor is "electrically connected" to the third transistor, even when the second transistor is in an OFF state.

In the descriptions herein, when a first element is "connected between" second and third elements, this description may indicate that the first, second, and third elements are connected to each other in series, and the second element is connected to the third element via the first element.

In the descriptions herein, when a circuit or the like "conducts" two wirings or the like, this description may indicate, for example, that the circuit or the like includes a transistor or the like, and the transistor or the like is provided in a current path between the two wirings or the like such that the transistor or the like enters an ON state.

In the descriptions herein, a predetermined direction parallel to the upper surface of the substrate will be referred to as an X direction, a direction parallel to the upper surface of the substrate and perpendicular to the X direction will be referred to as a Y direction, and a direction perpendicular to the upper surface of the substrate will be referred to as a Z direction.

In the descriptions herein, a direction along a predetermined plane will be referred to as a first direction, a direction intersecting the first direction along the predetermined surface will be referred to as a second direction, and a direction intersecting the predetermined plane will be referred to as a third direction. Each of the first, second, and third directions may or may not correspond to any of the X, Y, and Z directions.

In the descriptions herein, the reference for expressions such as "upper (above)" and "lower (below)" is the substrate on which a memory cell array is provided. For example, the direction away from the substrate along the Z direction will be referred to as an upward direction, and the direction that approaches the substrate along the Z direction will be referred to as a downward direction. Further, the lower surface or end of a certain element indicates the surface or end of the element closer to the substrate, and the upper surface or end of the element indicates the surface or end of the element opposite to the surface or end thereof closer to the substrate. Further, the surface of the element that intersects the X or Y direction will be referred to as a side surface or the like of the element.

First Embodiment

[Memory System 10]

FIG. 1 is a schematic block diagram illustrating the configuration of a memory system 10 according to a first embodiment.

The memory system 10 performs reading, writing, erasing or the like of user data according to a signal transmitted from a host computer 20. The memory system 10 is, for example, a memory chip, a memory card, an SSD or other systems capable of storing user data. The memory system 10 includes a plurality of memory dies MD that store user data, and a control die CD connected to the plurality of memory dies MD and the host computer 20. The control die CD includes, for example, a processor, a RAM, or the like, and executes a processing such as a conversion between a logical address and a physical address, bit error detection/correction, garbage collection (compaction), or wear leveling.

Figure 2:
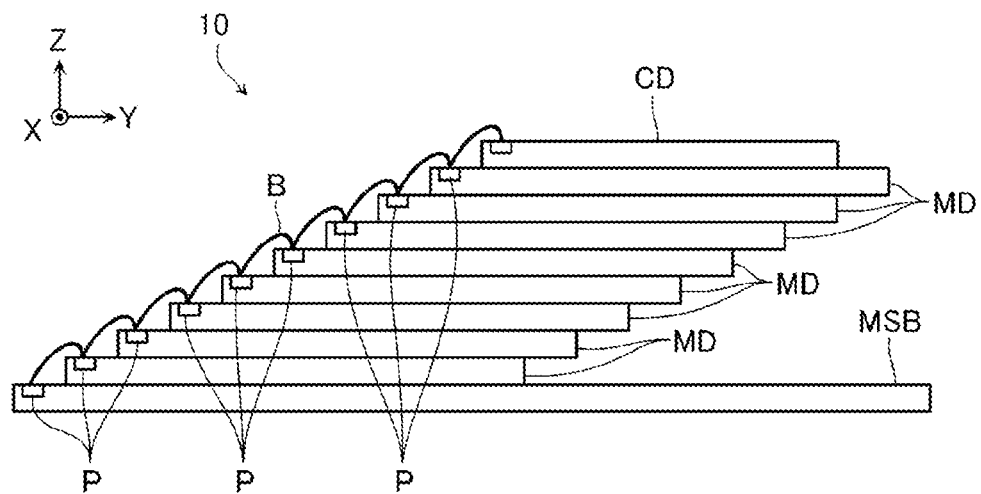
FIG. 2 is a schematic side view illustrating a configuration example of the memory system.
Figure 3:
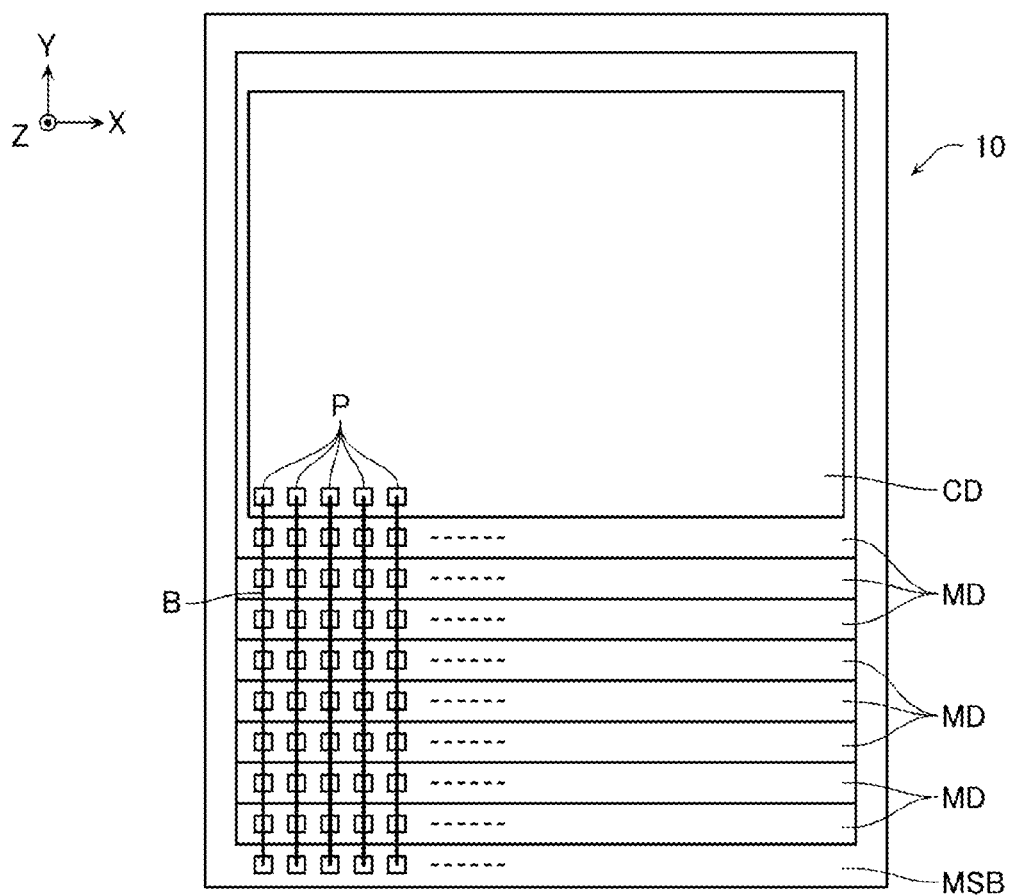
FIG. 3 is a schematic plan view illustrating the same configuration example of the memory system.

FIG. 2 is a schematic side view illustrating a configuration example of the memory system 10 according to the present embodiment. FIG. 3 is a schematic plan view illustrating the configuration example of the memory system 10. For the convenience of description, FIGS. 2 and 3 may omit a portion of the configuration.

As illustrated in FIG. 2, the memory system 10 according to the present embodiment includes a mounting board MSB, a plurality of memory dies MD stacked on the mounting board MSB, and a control die CD stacked on the memory dies MD. On the upper surface of the mounting board MSB, the end region in the Y direction is provided with pad electrodes P, and a portion of the other region is attached to the lower surface of a memory die MD via an adhesive or the like. On the upper surface of the memory die MD, the end region in the Y direction is provided with pad electrodes P, and the other region is attached to the lower surface of another memory die MD or the control die CD via an adhesive or the like. On the upper surface of the control die CD, the end region in the Y direction is provided with pad electrodes P.

As illustrated in FIG. 3, each of the mounting board MSB, the plurality of memory dies MD, and the control die CD includes the plurality of pad electrodes P arranged in the X direction. The pad electrodes P provided in the mounting board MSB, the plurality of memory dies MD, and the control die CD are connected to each other via bonding wires B.

The configurations illustrated in FIGS. 2 and 3 are merely an example, and the configuration may be changed. In the example illustrated in FIGS. 2 and 3, the control die CD is stacked on the plurality of memory dies MD, and the control die CD and the memory dies MD are connected to each other by the bonding wires B. In this configuration, the plurality of memory dies MD and the control die CD are disposed in one package. Alternatively, the control die CD may be disposed in a different package from the memory dies MD. The plurality of memory dies MD and the control die CD may be connected to each other via through-electrodes or the like, instead of the bonding wires B.

[Circuit Configuration of Memory Die MD]

Figure 4:
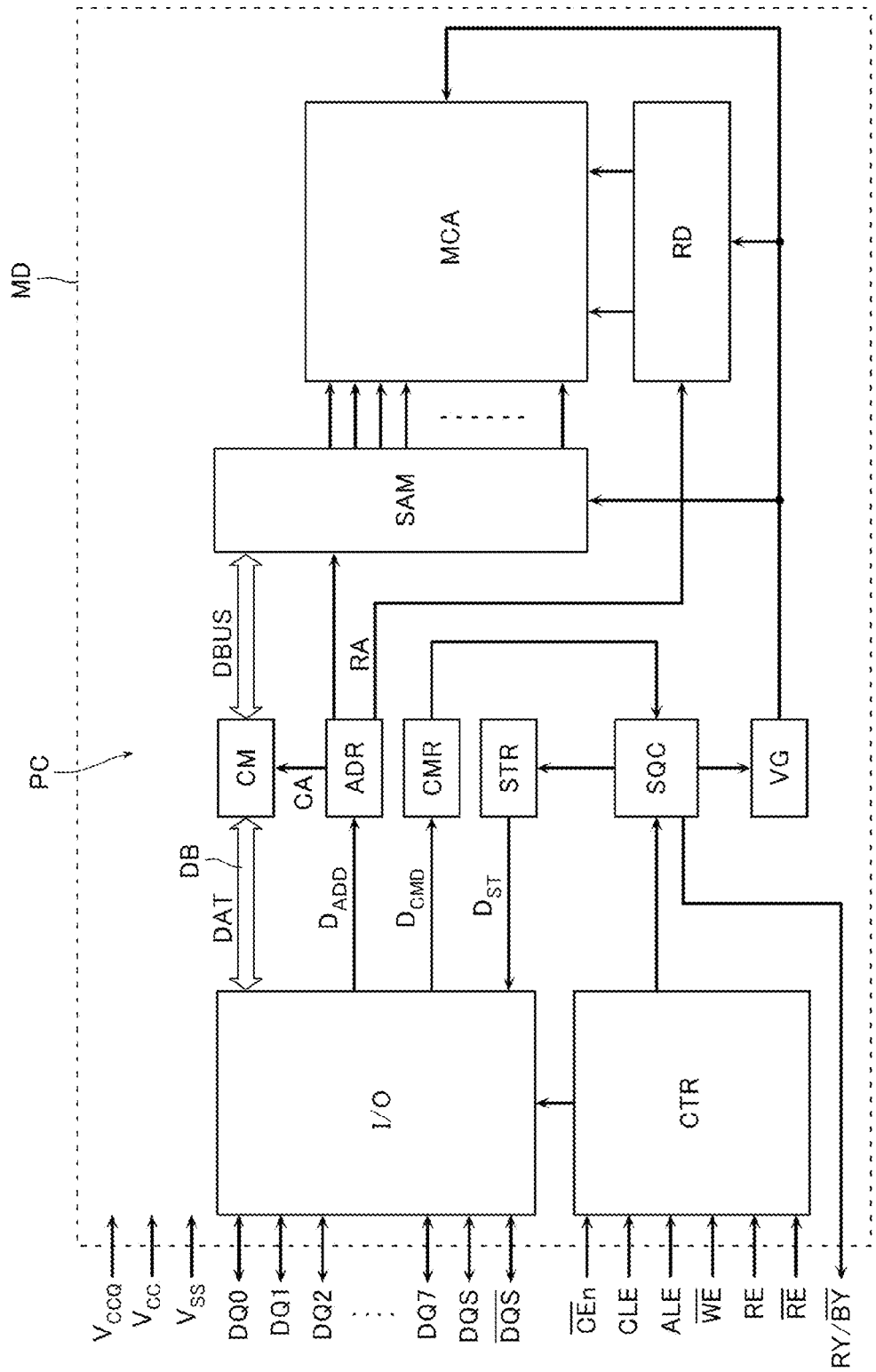
FIG. 4 is a schematic block diagram illustrating the configuration of a memory die according to the first embodiment.
Figure 5:
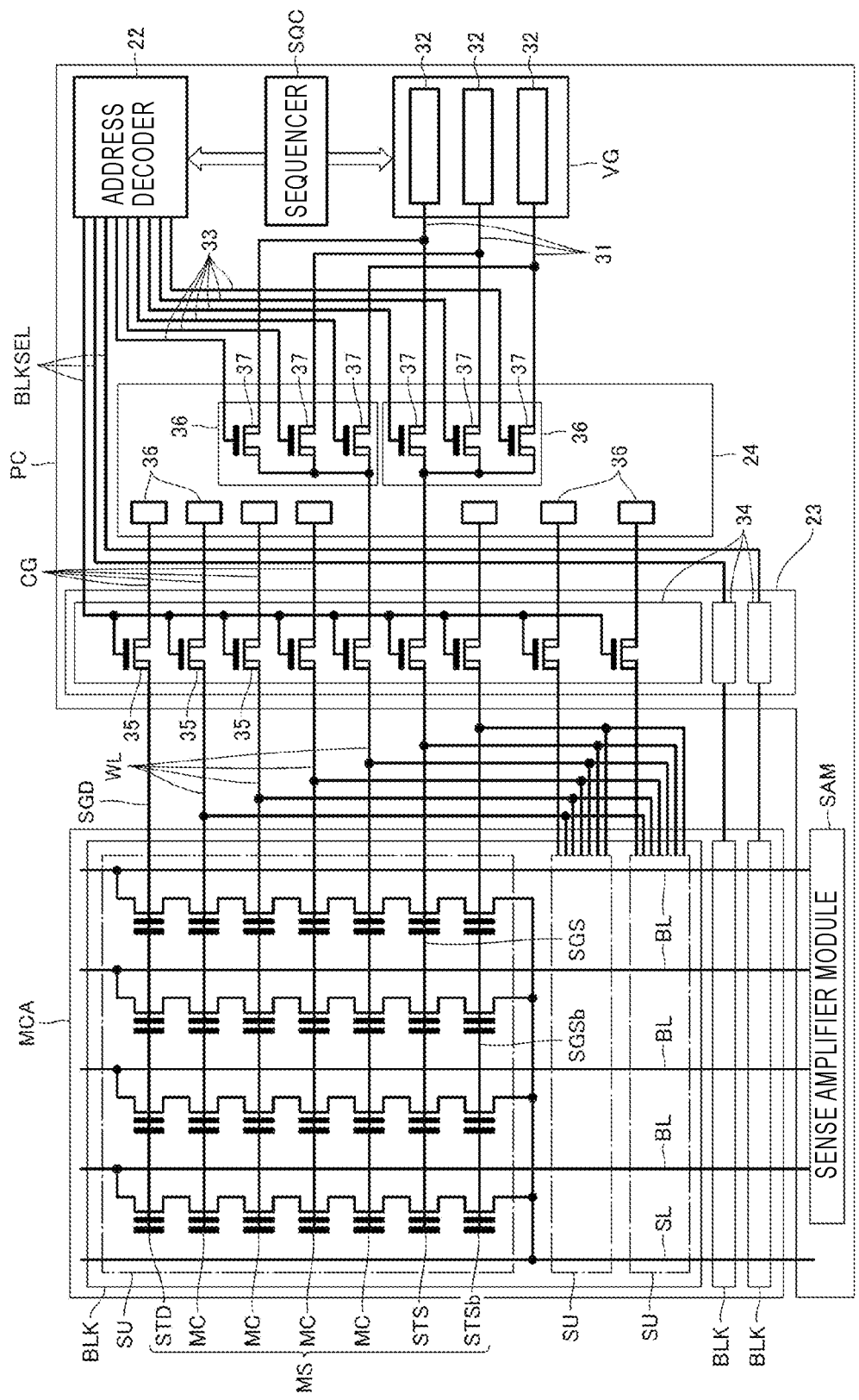
FIG. 5 is a schematic circuit diagram illustrating the configuration of a part of the memory die.
Figure 6:
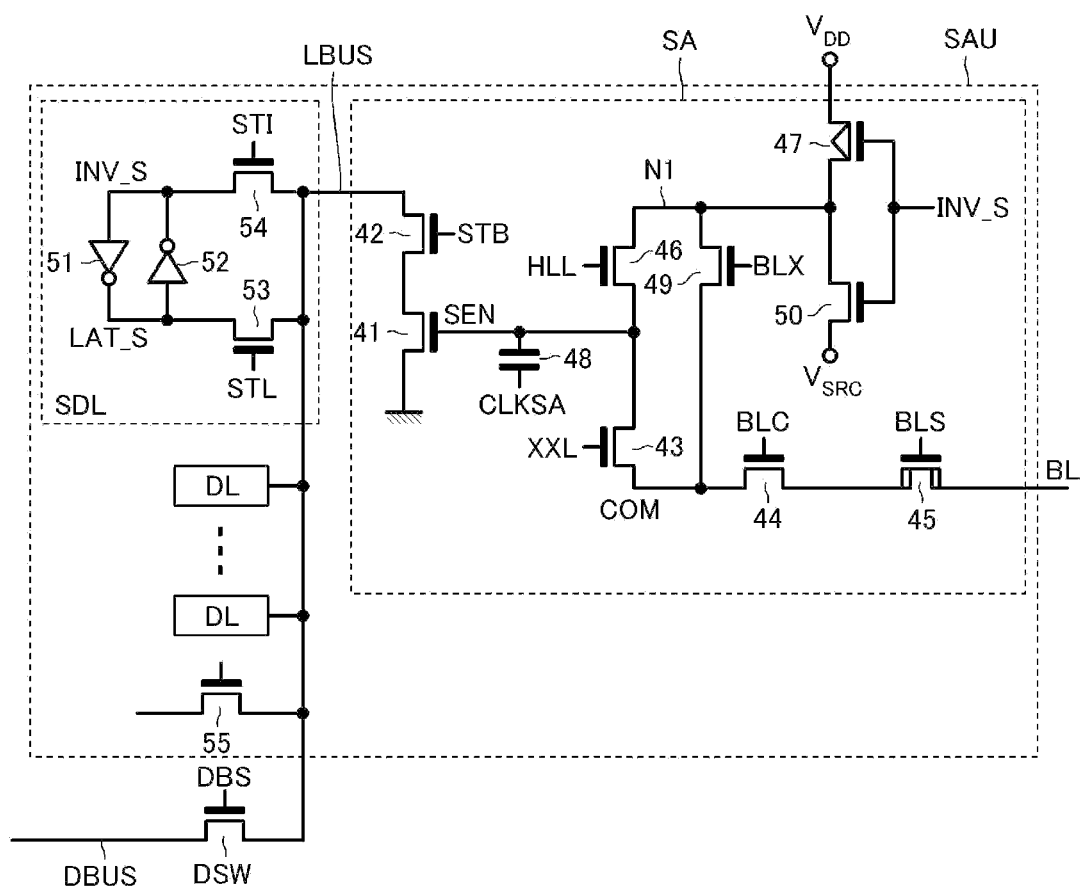
FIG. 6 is a schematic circuit diagram illustrating the configuration of a part of the memory die.

FIG. 4 is a schematic block diagram illustrating the configuration of the memory die MD according to the first embodiment. FIGS. 5 and 6 are schematic circuit diagrams illustrating the configuration of a part of the memory die MD.

FIG. 4 illustrates a plurality of control terminals and other components. The plurality of control terminals may be represented as control terminals that correspond to a high active signal (a positive logic signal), control terminals that correspond to a low active signal (a negative logic signal), and control terminals that correspond to both a high active signal and a low active signal. In FIG. 4, the code of a control terminal that corresponds to the low active signal includes an overline (upper line). In the descriptions herein, the code of the control terminal that corresponds to the low active signal includes a slash ("/").

As illustrated in FIG. 4, the memory die MD includes a memory cell array MCA that stores data, and a peripheral circuit PC connected to the memory cell array MCA. The peripheral circuit PC includes a voltage generation circuit VG, a row decoder RD, a sense amplifier module SAM, and a sequencer SQC. The peripheral circuit PC also includes a cache memory CM, an address register ADR, a command register CMR, and a status register STR. The peripheral circuit PC also includes an input/output control circuit I/O and a logic circuit CTR.

[Circuit Configuration of Memory Cell Array MCA]

As illustrated in FIG. 5, the memory cell array MCA includes a plurality of memory blocks BLK. Each memory block BLK includes a plurality of string units SU. Each string unit SU includes a plurality of memory strings MS. One end of each of the plurality of memory strings MS is connected to the peripheral circuit PC via a bit line BL. The other end of each of the plurality of memory strings MS is connected to the peripheral circuit PC via a common source line SL.

The memory string MS includes a drain-side select transistor STD, a plurality of memory cells MC (also referred to as memory transistors), source-side select transistors STS and STSb that are connected to each other in series between a bit line BL and a source line SL. Hereinafter, the drain-side select transistor STD and the source-side select transistors STS and STSb may be simply referred to as the select transistors STD, STS, and STSb.

Each memory cell MC is a field-effect type transistor that includes a semiconductor layer that functions as a channel region, a gate insulating film that includes a charge storage film, and a gate electrode. A threshold voltage of the memory cell MC varies according to an amount of charge in the charge storage film. One-bit or multiple-bit data is stored in the memory cell MC. Further, word lines WL are connected to the gate electrodes of the plurality of memory cells MC that correspond to one memory string MS, respectively. The word lines WL are connected in common to all of the memory strings MS, respectively, in one memory block BLK.

The select transistors STD, STS, and STSb are field-effect type transistors each provided with a semiconductor layer that functions as a channel region, a gate insulating film, and a gate electrode. Select gate lines SGD, SGS, and SGSb are connected to the gate electrodes of the select transistors STD, STS, and STSb, respectively. The drain-side select gate line SGD is provided to correspond to each string unit SU, and is connected in common to all of the memory strings MS in one string unit SU. The source-side select gate line SGS is connected in common to all of the memory strings MS in the plurality of string units SU. The source-side select gate line SGSb is connected in common to all of the memory strings MS in the plurality of string units SU.

[Circuit Configuration of Voltage Generation Circuit VG]

As illustrated in FIG. 5, the voltage generation circuit VG (FIG. 4) is connected to a plurality of voltage supply lines 31. The voltage generation circuit VG includes, for example, step-down circuits such as regulators and step-up circuits such as charge pump circuits 32. The step-down circuits and the step-up circuits are connected to voltage supply lines through which a power voltage $V_{CC}$ and a ground voltage $V_{SS}$ (FIG. 4) are supplied, respectively. The voltage supply lines are connected to the pad electrodes P described with reference to, for example, FIGS. 2 and 3. The voltage generation circuit VG generates a plurality of operation voltages to be applied to the bit lines BL, the source line SL, the word lines WL, and the select gate lines SGD, SGS, and SGSb, when a read operation, a write sequence or an erase sequence is performed with respect to the memory cell array MCA according to, for example, a control signal from the sequencer SQC, and outputs the operation voltages to the plurality of voltage supply lines 31 at the same time. The operation voltages output from the voltage supply lines 31 are adjusted according to a control signal from the sequencer SQC.

[Circuit Configuration of Row Decoder RD]

For example, as illustrated in FIG. 5, the row decoder RD (FIG. 4) includes an address decoder 22 that decodes address data $D_{ADD}$, and a block selection circuit 23 and a voltage selection circuit 24 that transfer an operation voltage to the memory cell array MCA according to an output signal of the address decoder 22.

The address decoder 22 includes a plurality of block selection lines BLKSEL and a plurality of voltage selection lines 33. For example, the address decoder 22 sequentially acquires a row address RA in the address register ADR (FIG. 4) according to a control signal from the sequencer SQC, and decodes the row address RA. Then, the address decoder 22 turns ON a predetermined block select transistor 35 and a predetermined voltage selection transistor 37 that correspond to the row address RA, and turns OFF the other block select transistors 35 and voltage selection transistors 37. For example, the address decoder 22 brings the voltages of a predetermined block selection line BLKSEL and a predetermined voltage selection line 33 into the "H" state, and brings the other voltages into the "L" state. When a P-channel type transistor rather than an N-channel type transistor is used, voltages are applied in reverse to the wirings.

In the illustrated example, the address decoder 22 is provided with one block selection line BLKSEL for one memory block BLK. However, this configuration may be changed. For example, one block selection line BLKSEL may be provided for two or more memory blocks BLK.

The block selection circuit 23 includes a plurality of block selectors 34 that corresponds to the memory blocks BLK. Each block selector 34 includes a plurality of block select transistors 35 that corresponds to the word lines WL and the select gate lines SGD, SGS, and SGSb, respectively. The block select transistors 35 are, for example, field-effect type high breakdown voltage transistors. The drain electrodes of the block select transistors 35 are electrically connected to the corresponding word lines WL and select gate lines SGD, SGS, and SGSb, respectively. The source electrodes of the block select transistors 35 are electrically connected to the voltage supply lines 31, respectively, via wirings CG and the voltage selection circuit 24. The gate electrodes of the block select transistors 35 are connected in common to a corresponding block selection line BLKSEL.

The block selection circuit 23 further includes a plurality of transistors (not illustrated). These transistors are field-effect type high breakdown voltage transistors connected between the select gate lines SGD, SGS, and SGSb and the voltage supply line to which the ground voltage $V_{SS}$ is supplied. These transistors supply the ground voltage $V_{SS}$ to the select gate lines SGD, SGS, and SGSb of a non-selected memory block BLK.

The voltage selection circuit 24 includes a plurality of voltage selectors 36 that corresponds to the word lines WL and the select gate lines SGD, SGS, and SGSb. Each voltage selector 36 includes a plurality of voltage selection transistors 37. The voltage selection transistors 37 are, for example, field-effect type high breakdown voltage transistors. The drain terminals of the voltage selection transistors 37 are electrically connected to the corresponding word lines WL and select gate line SGD, SGS, and SGSb, respectively, via the wirings CG and the block selection circuit 23. The source terminals of the voltage selection transistors 37 are electrically connected to the corresponding voltage supply lines 31, respectively. The gate electrodes of the voltage selection transistors 37 are connected to the corresponding voltage selection lines 33, respectively.

In the illustrated example, the wiring CG is connected to the voltage supply line 31 via one voltage selection transistor 37. However, this configuration is merely an example, and the configuration may be changed. For example, the wiring CG may be connected to the voltage supply lines 31 via two or more voltage selection transistors 37.

[Circuit Configuration of Sense Amplifier Module SAM]

The sense amplifier module SAM includes, for example, a plurality of sense amplifier units SAU that correspond to the plurality of bit lines BL. As illustrated in FIG. 6, each sense amplifier unit SAU includes a sense amplifier SA connected to the bit line BL, a wiring LBUS connected to the sense amplifier SA, a latch circuit SDL connected to the wiring LBUS, a plurality of latch circuits DL connected to the wiring LBUS, and a charging transistor 55 for precharging, which is connected to the wiring LBUS. The wiring LBUS within the sense amplifier unit SAU is connected to a wiring DBUS via a switch transistor DSW.

As illustrated in FIG. 6, the sense amplifier SA includes a sense transistor 41 that discharges electric charges in the wiring LBUS according to the current that flows through the bit line BL. A source electrode of the sense transistor 41 is connected to the voltage supply line to which the ground voltage $V_{SS}$ is supplied. A drain electrode is connected to the wiring LBUS via a switch transistor 42. A gate electrode is connected to the bit line BL via a sense node SEN, a discharging transistor 43, a node COM, a clamp transistor 44, and a high breakdown voltage transistor 45. The sense node SEN is connected to an internal control signal line CLKSA via a capacitor 48.

The sense amplifier SA includes a voltage transfer circuit that selectively causes the node COM or the sense node SEN to be conductive with either the voltage supply line to which a voltage $V_{DD}$ is supplied or the voltage supply line to which a voltage $V_{SRC}$ is supplied, according to data latched by the latch circuit SDL. The voltage transfer circuit includes a node N1, a charging transistor 46 connected between the node N1 and the sense node SEN, a charging transistor 49 connected between the node N1 and the node COM, a charging transistor 47 connected between the node N1 and the voltage supply line to which the voltage $V_{DD}$ is supplied, and a discharging transistor 50 connected between the node N1 and the voltage supply line to which the voltage $V_{SRC}$ is supplied. Gate electrodes of the charging transistor 47 and the discharging transistor 50 are connected to a node INV_S of the latch circuit SDL, in common.

The sense transistor 41, the switch transistor 42, the discharging transistor 43, the clamp transistor 44, the charging transistor 46, the charging transistor 49, and the discharging transistor 50 are, for example, enhancement type NMOS transistors. The high breakdown voltage transistor 45 is, for example, a depletion type NMOS transistor. The charging transistor 47 is, for example, a PMOS transistor.

A gate electrode of the switch transistor 42 is connected to a signal line STB. A gate electrode of the discharging transistor 43 is connected to a signal line XXL. A gate electrode of the clamp transistor 44 is connected to a signal line BLC. A gate electrode of the high breakdown voltage transistor 45 is connected to a signal line BLS. A gate electrode of the charging transistor 46 is connected to a signal line HLL. A gate electrode of the charging transistor 49 is connected to a signal line BLX. These signal lines STB, XXL, BLC, BLS, HLL, and BLX are connected to the sequencer SQC.

The latch circuit SDL includes nodes LAT_S and INV_S, an inverter 51 including an output terminal connected to the node LAT_S and an input terminal connected to the node INV_S, an inverter 52 including an input terminal connected to the node LAT_S and an output terminal connected to the node INV_S, a switch transistor 53 connected to the node LAT_S and the wiring LBUS, and a switch transistor 54 connected to the node INV_S and the wiring LBUS. The switch transistors 53 and 54 are, for example, NMOS transistors. A gate electrode of the switch transistor 53 is connected to the sequencer SQC via a signal line STL. A gate electrode of the switch transistor 54 is connected to the sequencer SQC via a signal line STI.

Each of the latch circuits DL is configured in substantially the same manner as the latch circuit SDL. Meanwhile, as described above, the node INV_S of the latch circuit SDL is conductive with the gate electrodes of the charging transistor 47 and the discharging transistor 50 in the sense amplifier SA. With respect to this point, the latch circuits DL are different from the latch circuit SDL.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS.

Each of the above-described signal lines STB, HLL, XXL, BLX, BLC, and BLS is connected in common among all of the sense amplifier units SAU in the sense amplifier module SAM. Each of the above-described voltage supply lines to which the voltage $V_{DD}$ and the voltage $V_{SRC}$ are supplied is connected in common across all of the sense amplifier units SAU in the sense amplifier module SAM. Each of the signal line STI and the signal line STL in the latch circuit SDL is connected in common across all of the sense amplifier units SAU in the sense amplifier module SAM. Likewise, each of signal lines in the plurality of latch circuits DL, which corresponds to each of the signal line STI and the signal line STL, is connected in common across all of the sense amplifier units SAU in the sense amplifier module SAM.

[Circuit Configuration of Cache Memory CM]

The cache memory CM (FIG. 4) includes a plurality of latch circuits connected to the latch circuits within the sense amplifier module SAM via the wiring DBUS. Data DAT in the plurality of latch circuits are sequentially transferred to the sense amplifier module SAM or the input/output control circuit I/O.

A decoding circuit and a switch circuit (not illustrated) are connected to the cache memory CM. The decoding circuit decodes a column address CA stored in the address register ADR (FIG. 4). The switch circuit causes a latch circuit corresponding to the column address CA to be conductive with a bus DB (FIG. 4) according to an output signal of the decoding circuit.

[Circuit Configuration of Sequencer SQC]

The sequencer SQC (FIG. 4) outputs an internal control signal to the row decoder RD, the sense amplifier module SAM, and the voltage generation circuit VG according to command data DCMD stored in the command register CMR. The sequencer SQC outputs status data $D_{ST}$ indicating its own state to the status register STR. The sequencer SQC generates a Ready/Busy signal, and outputs the Ready/Busy signal to a terminal RY//BY. The terminal RY//BY is implemented as, for example, one of the pad electrodes P described with reference to FIGS. 2 and 3.

[Circuit Configuration of Input/output Control Circuit I/O]

The input/output control circuit I/O includes data signal input/output terminals DQ0 to DQ7, clock signal input/output terminals DQS and /DQS, and an input circuit (such as a comparator) and an output circuit (such as an off chip driver (OCD) circuit) which are connected to the data signal input/output terminals DQ0 to DQ7. The input/output circuit I/O includes a shift register and a buffer circuit connected to the input circuit and the output circuit. The input circuit, the output circuit, the shift register, and the buffer circuit are connected to terminals to which a power voltage $V_{CCQ}$ and the ground voltage $V_{SS}$ are supplied, respectively. The data signal input/output terminals DQ0 to DQ7, the clock signal input/output terminals DQS and /DQS, and the terminal to which the power voltage $V_{CCQ}$ is supplied are implemented as, for example, the pad electrodes P described with reference to FIGS. 2 and 3. Data input through the data signal input/output terminals DQ0 to DQ7 is output to the cache memory CM, the address register ADR, or the command register CMR from the buffer circuit according to an internal control signal from the logic circuit CTR. Data output through the data signal input/output terminals DQ0 to DQ7 is input to the buffer circuit from the cache memory CM or the status register STR according to an internal control signal from the logic circuit CTR.

[Circuit Configuration of Logic Circuit CTR]

The logic circuit CTR (FIG. 4) receives an external control signal from the control die CD through external control terminals /CEn, CLE, ALE, /WE, RE, and /RE, and accordingly outputs an internal control signal to the input/output control circuit I/O. The external control terminals /CEn, CLE, ALE, /WE, RE, and /RE are implemented as, for example, the pad electrodes P described with reference to FIGS. 2 and 3.

[Structure of Memory Die MD]

Figure 7:
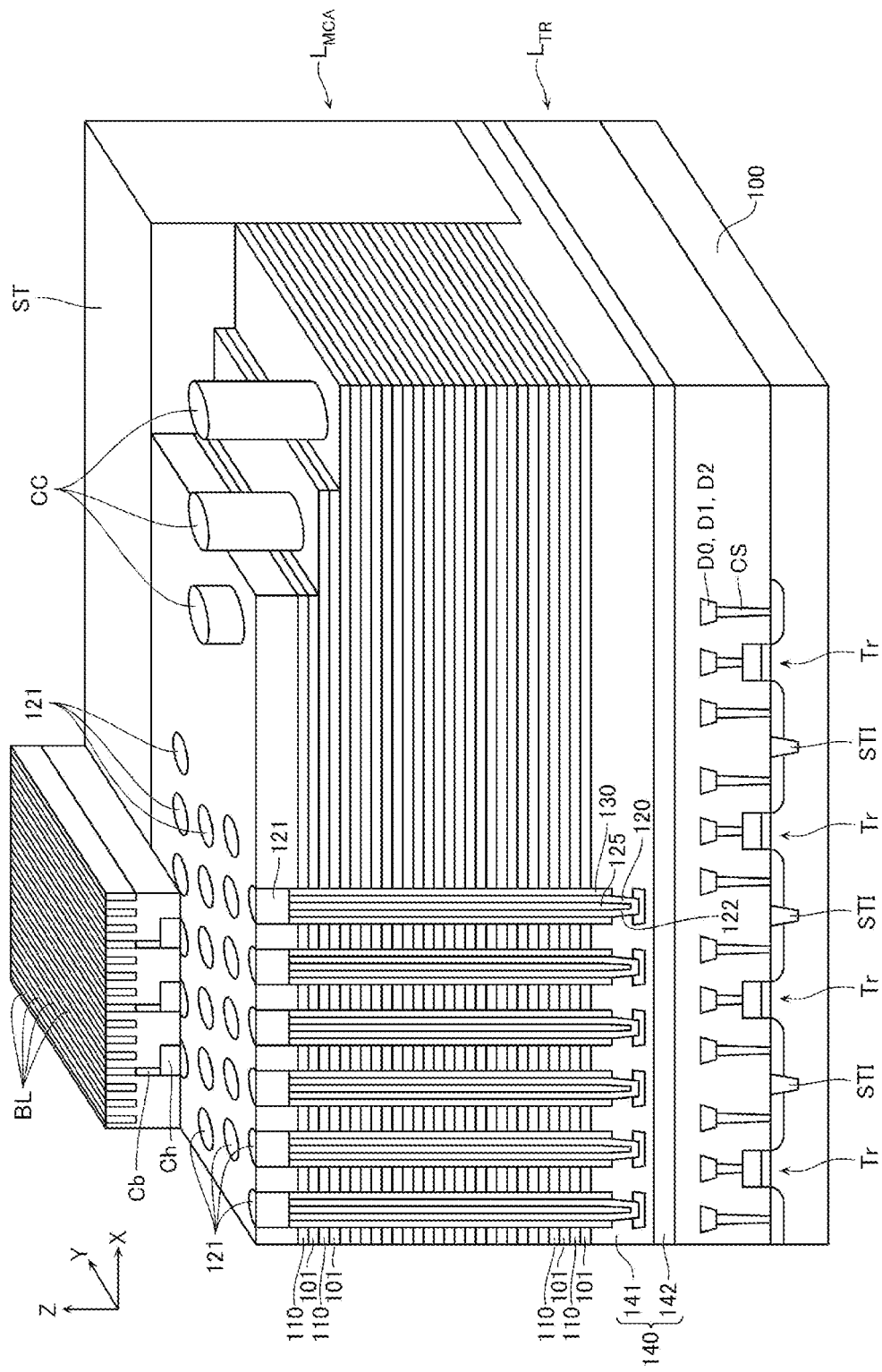
FIG. 7 is a schematic perspective view of the memory die.
Figure 8:
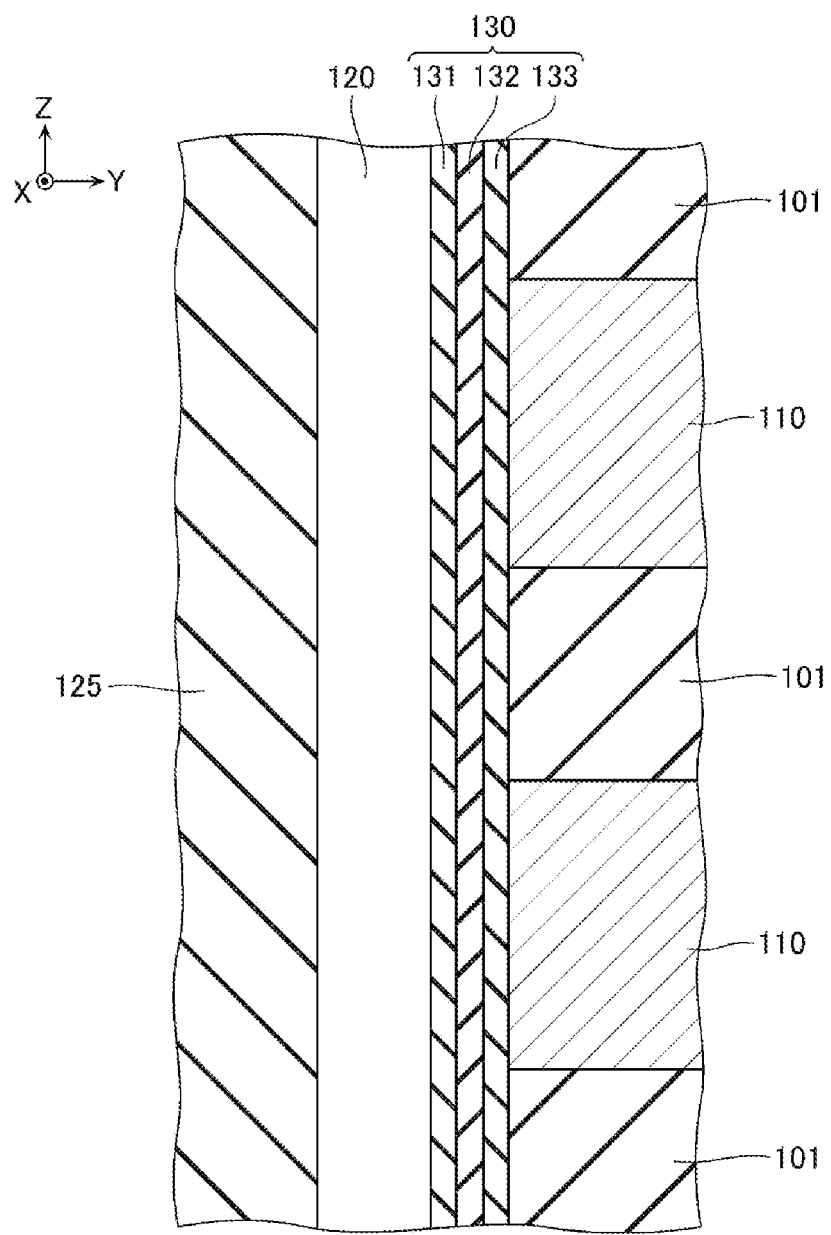
FIG. 8 is a schematic view of a part of the structure illustrated in FIG. 7, in an enlarged scale.

FIG. 7 is a schematic perspective view of the memory die MD. FIG. 8 is a schematic view of a part of the structure illustrated in FIG. 7, in an enlarged scale. As FIGS. 7 and 8 illustrate a schematic configuration of the memory die MD, the number, the shape, the arrangement and the like of the respective components are not limited to those illustrated therein.

As illustrated in FIG. 7, the memory die MD includes a semiconductor substrate 100, a transistor layer $L_{TR}$ formed on the semiconductor substrate 100, wiring layers D0, D1, and D2 formed above the transistor layer $L_{TR}$, a memory cell array layer $L_{MCA}$ formed above the wiring layers D0, D1, and D2, and a plurality of wiring layers formed above the memory cell array layer $L_{MCA}$.

The semiconductor substrate 100 is a semiconductor substrate made of, for example, P-type silicon (Si), which contains a P-type impurity such as boron (B). On the surface of the semiconductor substrate 100, a semiconductor region and an insulating region STI are formed. The semiconductor region functions as a channel region, etc., for each of a plurality of transistors Tr that make up the peripheral circuit PC.

The transistor layer $L_{TR}$ includes gate electrodes of the plurality of transistors Tr, and contacts CS connected to the plurality of transistors Tr. The gate electrodes and the contacts CS may include, for example, stacked films including barrier conductive films of titanium nitride (TiN) or the like and metal films of tungsten (W) or the like.

The wiring layers D0, D1, and D2 include a plurality of wirings. The plurality of wirings are electrically connected to at least one of a configuration in the memory cell array MCA and a configuration in the peripheral circuit PC. The plurality of wirings may include, for example, stacked films including barrier conductive films of titanium nitride (TiN) or the like and metal films of tungsten (W) or the like.

The memory cell array layer $L_{MCA}$ includes a plurality of conductive layers 110 arranged in the Z direction, a plurality of semiconductor pillars 120 extending in the Z direction, and a plurality of gate insulating films 130 formed between the plurality of conductive layers 110 and the plurality of semiconductor pillars 120.

The conductive layer 110 is a substantially plate-shaped conductive layer extending in the X direction and the Y direction. Among the conductive layers 110, one or more conductive layers 110 located in the lowermost layer function as the source-side select gate lines SGS and SGSb (FIG. 5) and the gate electrodes of the plurality of source-side select transistors STS and STSb connected thereto. A plurality of conductive layers 110 located above these functions as the word lines WL (FIG. 5) and the gate electrodes of the plurality of memory cells MC (FIG. 5) connected thereto. One or more conductive layers 110 located above these function as the drain-side select gate lines SGD and the gate electrodes of the plurality of drain-side select transistors STD (FIG. 5) connected thereto. The conductive layer 110 may include a stacked film including a barrier conductive film of titanium nitride (TiN) or the like and a metal film of tungsten (W) or the like. The conductive layer 110 may contain, for example, polycrystalline silicon containing an impurity such as phosphorous (P) or boron (B). Insulating layers 101 of silicon oxide ($SiO_2$) or the like are formed between the conductive layers 110 arranged in the Z direction.

A conductive layer 140 is formed below the conductive layers 110. The conductive layer 140 functions as the source line SL (FIG. 5). The conductive layer 140 includes a semiconductor layer 141 connected to the lower ends of the semiconductor pillars 120, and a conductive layer 142 connected to the lower surface of the semiconductor layer 141. The semiconductor layer 141 may contain, for example, polycrystalline silicon containing an impurity such as phosphorous (P) or boron (B). The conductive layer 142 may include, for example, a conductive layer of a metal (such as tungsten (W)), tungsten silicide or the like or another conductive layer. An insulating layer 101 of silicon oxide ($SiO_2$) or the like is formed between the conductive layer 140 and the conductive layer 110.

Contacts CC extending in the Z direction are connected to the conductive layers 110, and 140. Each contact CC may include, for example, a stacked film including a barrier conductive film of titanium nitride (TiN) or the like and a metal film of tungsten (W) or the like.

The semiconductor pillars 120 are arranged in a predetermined pattern in the X direction and the Y direction. The semiconductor pillar 120 functions as a channel region of the plurality of memory cells MC and the select transistors STD, STS, and STSb in one memory string MS (FIG. 5). The semiconductor pillar 120 is, for example, a semiconductor layer of polycrystalline silicon (Si) or the like. The semiconductor pillar 120 has a substantially cylindrical shape, and an insulating layer 125 of silicon oxide or the like is formed in the central portion. The outer peripheral surface of the semiconductor pillar 120 is surrounded by each of the conductive layers 110, and faces the conductive layers 110.

Impurity regions 121 containing an N-type impurity such as phosphorus (P) are formed on upper ends of the semiconductor pillars 120. The impurity regions 121 are connected to the bit lines BL via contacts Ch and contacts Cb.

Impurity regions 122 containing an N-type impurity such as phosphorus (P) are formed on lower ends of the semiconductor pillars 120. The impurity regions 122 are connected to the semiconductor layer 141 of the conductive layer 140. A portion of the semiconductor pillar 120, which is located just above the impurity region 122, functions as the channel region of the source side select transistor STSb.

The gate insulating film 130 has a substantially cylindrical shape covering the outer peripheral surface of the semiconductor pillar 120. For example, as illustrated in FIG. 8, the gate insulating film 130 includes a tunnel insulating film 131, a charge storage film 132, and a block insulating film 133, which are stacked between the semiconductor pillar 120 and the conductive layers 110. The tunnel insulating film 131 and the block insulating film 133 are, for example, insulating films of silicon oxide ($SiO_2$) or the like. The charge storage film 132 is, for example, a film of silicon nitride ($Si_3N_4$) or the like, which is capable of storing electric charges. The tunnel insulating film 131, the charge storage film 132, and the block insulating film 133 have substantially cylindrical shapes, and extend in the Z direction along the outer peripheral surface of the semiconductor pillar 120.

FIG. 8 illustrates an example where the gate insulating film 130 includes the charge storage film 132 of silicon nitride or the like. However, the gate insulating film 130 may include, for example, a floating gate of polycrystalline silicon or the like, which contains an N-type or P-type impurity.

The plurality of wiring layers formed above the memory cell array layer $L_{MCA}$ includes the bit lines BL (FIG. 7) and the pad electrodes P (FIGS. 2 and 3).

The bit line BL (FIG. 7) may include, for example, a stacked film including a barrier conductive film of titanium nitride (TiN) or the like, and a metal film of copper (Cu) or the like. The bit lines BL are arranged in the X direction and extend in the Y direction. Each bit line BL is connected to one semiconductor pillar 120 in each string unit SU (FIG. 5).

The pad electrode P (FIGS. 2 and 3) may include, for example, a stacked film including a barrier conductive film of titanium nitride (TiN) or the like and a metal film of aluminum (Al) or the like.

[Threshold Voltage of Memory Cell MC]

Next, a threshold voltage of the memory cell MC will be described with reference to FIG. 9.

As described above, the memory cell array MCA includes the plurality of memory cells MC. When a write sequence is performed on these memory cells MC, threshold voltages of the memory cells MC are controlled to be in one of a plurality of states.

Figure 9:
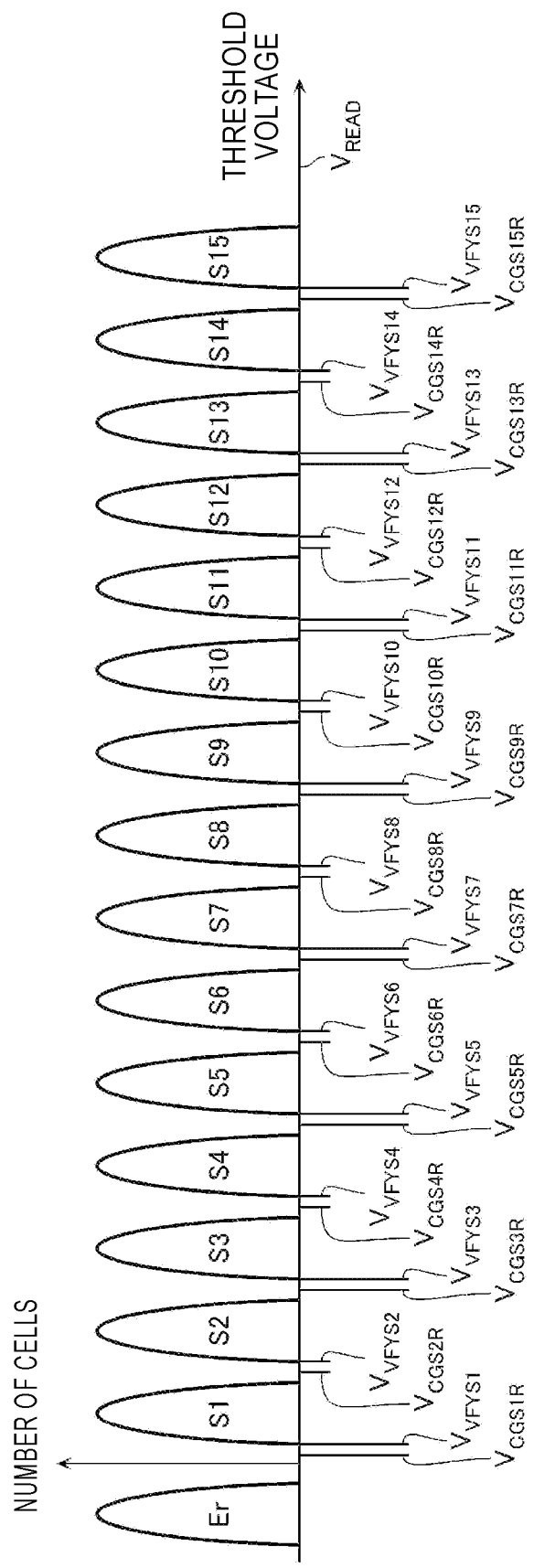
FIG. 9 is a schematic histogram illustrating a threshold voltage of a memory cell.

FIG. 9 is a schematic histogram illustrating a threshold voltage of a memory cell MC in which 4-bit data is stored. The horizontal axis indicates a threshold voltage, and the vertical axis indicates the number of memory cells MC in the memory cell array MCA.

In the example of FIG. 9, the threshold voltages of the memory cells MC are controlled to be one of 16 states. For example, an Er state corresponds to the lowest threshold voltage (a threshold voltage of the memory cell MC in the erased state). For example, data "1111" may be assigned to the memory cell MC corresponding to the Er state. An S1 state corresponds to a threshold voltage higher than the threshold voltage corresponding to the Er state. For example, data "1110" may be assigned to the memory cell MC corresponding to the S1 state. Hereinafter, similarly, an S2 state to an S15 state in the drawing correspond to threshold voltages higher than threshold voltages corresponding to the S1 state to the S14 state, respectively. Memory cells MC corresponding to these distributions are assigned different 4-bit data, respectively.

For example, the threshold voltage of the memory cell MC controlled to be in the Er state is smaller than a read voltage $V_{CGS1R}$ and a verification voltage $V_{VFYS1}$ in FIG. 9. For example, the threshold voltage of the memory cell MC controlled to be in the S1 state is larger than the read voltage $V_{CGS1R}$ and the verification voltage $V_{VFYS1}$ in FIG. 9, and is smaller than a read voltage $V_{CGS2R}$ and a verification voltage $V_{VFYS2}$. For example, the threshold voltage of the memory cell MC controlled to be in the S2 state is larger than the read voltage $V_{CGS2R}$ and the verification voltage $V_{VFYS2}$ in FIG. 9, and is smaller than a read voltage $V_{CGS3R}$ and a verification voltage $V_{VFYS3}$. Hereinafter, similarly, the threshold voltages of the memory cells MC controlled to be in the S3 state to the S15 state in the drawing are controlled to be within predetermined ranges. The threshold voltages of all memory cells MC are smaller than a read pass voltage $V_{READ}$ in FIG. 9.

[Read Operation]

Next, descriptions will be made on a read operation of a semiconductor storage device according to the present embodiment, with reference to FIGS. 10 and 11.

Figure 10:
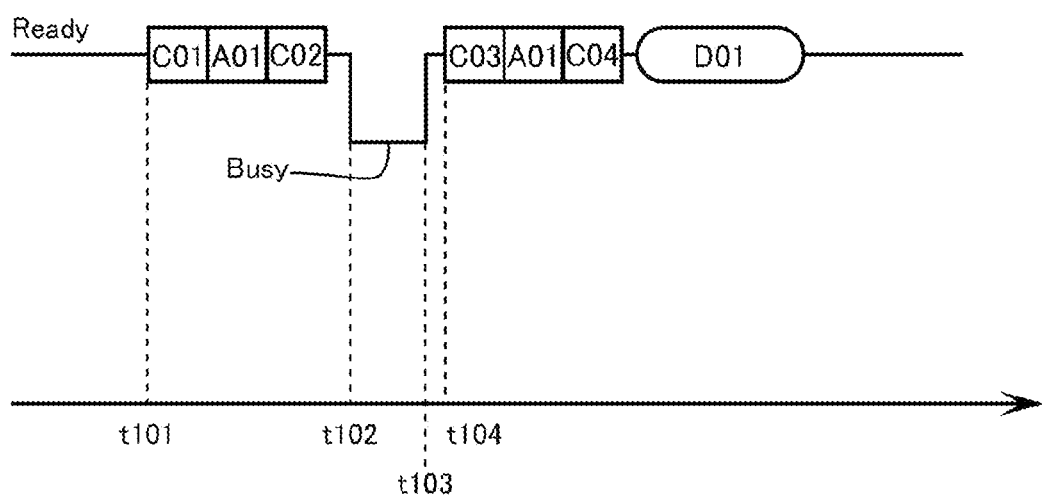
FIG. 10 is a schematic waveform diagram illustrating a read operation.

FIG. 10 is a schematic waveform diagram illustrating the read operation. A signal waveform illustrated in FIG. 10 indicates a signal of the terminal RY//BY (FIG. 4) of the memory die MD.

At the timing t101, the terminal RY//BY (FIG. 4) of the memory die MD is in the "H" state. At the timing t101, the control die CD inputs a command C01 to the memory die MD, inputs an address A01, and then, inputs a command C02. The command C01 is a command to execute a read operation. When the command C01 is input, for example, 8-bit data corresponding to the command C01 is set in the data signal input/output terminals DQ0 to DQ7, and "L, H, L" are set in the external control terminals /CEn, CLE, and ALE. In this state, the L state of the external control terminal /WE is raised to the H state. Accordingly, the command C01 is latched in the command register CMR, as the command data DCMD (FIG. 4). When the address A01 is input, for example, 8-bit data in the address A01 is sequentially set in the data signal input/output terminals DQ0 to DQ7, and "L, L, H" are set in the external control terminals /CEn, CLE, and ALE. In this state, the L state of the external control terminal /WE is raised to the H state many times. Accordingly, the address A01 is latched in the address register ADR, as the address data $D_{ADD}$ (FIG. 4). The command C02 is a command to start the read operation. The input of the command C02 is performed in the same manner as the input of the command C01.

At the timing t102, the read operation by the memory die MD is started, and the terminal RY//BY (FIG. 4) of the memory die MD enters into the "L" state.

At the timing t103, the read operation by the memory die MD is ended, and the terminal RY//BY (FIG. 4) of the memory die MD enters into the "H" state.

At the timing t104, the control die CD inputs a command C03 to the memory die MD, inputs the address A01, and then, inputs a command C04. The command C03 is a command to output the data read by the read operation. The command C04 is a command to start the output of data. The input of the commands C03 and C04 is performed in the same manner as the input of the command C01. Next, the control die CD reads data D01 from the memory die MD. When the data D01 is read, for example, the acquisition of 8-bit data output from the data signal input/output terminals DQ0 to DQ7, and the conversion of a signal to be input to the external control terminals RE and /RE are alternately executed. The control die CD performs bit error detection/correction or the like on the data, and then, transfers the data to the host computer 20. Although omitted in FIG. 10, the command and the address may be input again when the data D01 is read.

Figure 11:
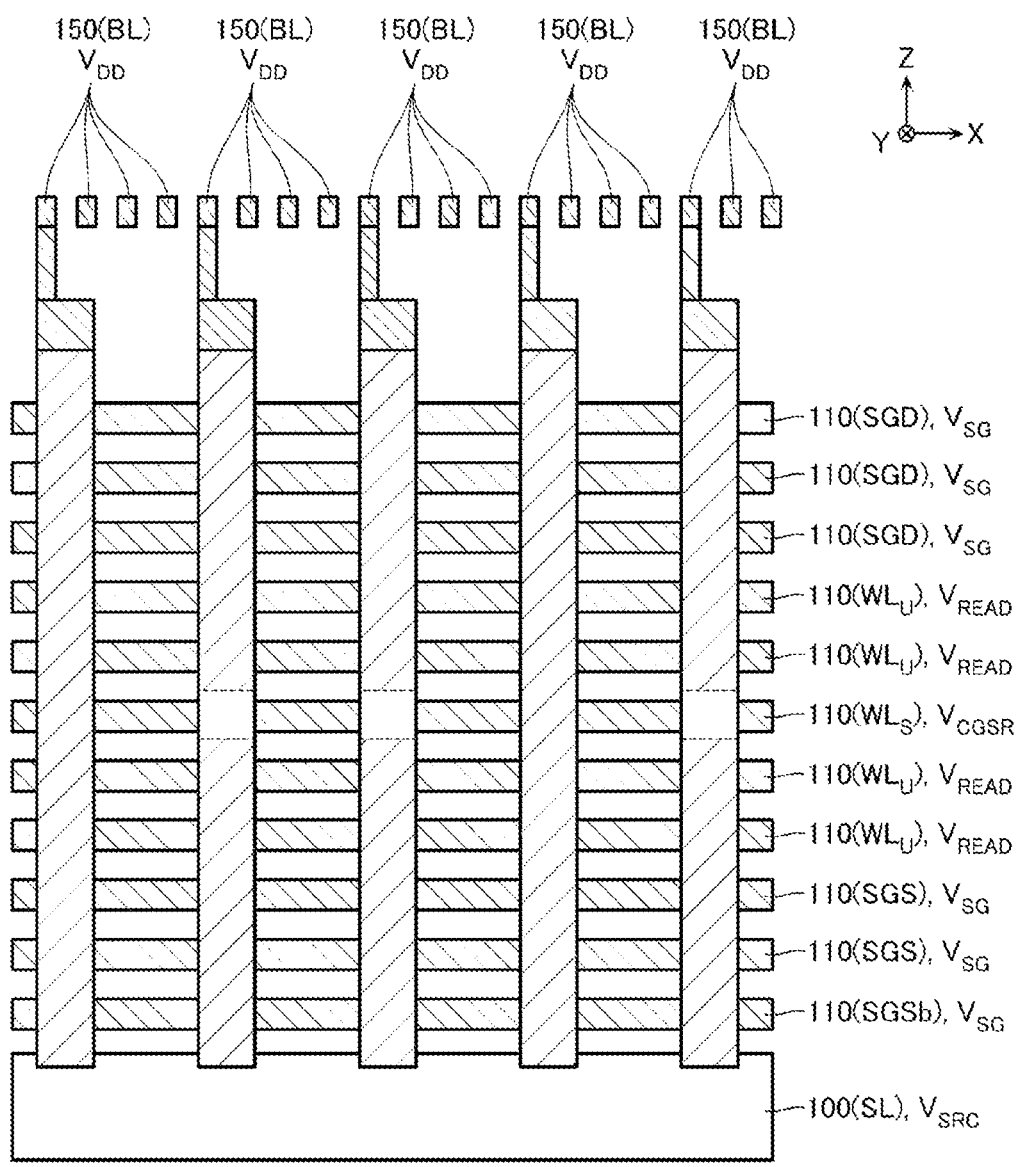
FIG. 11 is a schematic sectional view of a part of the memory die MD illustrating voltages applied during the read operation.

FIG. 11 is a schematic sectional view of a part of the memory die MD illustrating voltages applied during the read operation. In the following descriptions, a word line WL that is an operation target may be referred to as a selected word line $WL_S$, and the other word lines WL may be referred to as non-selected word lines $WL_U$. In the following descriptions, among the memory cells MC in the string unit SU, memory cells MC connected to the selected word line $WL_S$ may be referred to as "selected memory cells MC".

During the read operation, the memory die MD performs, for example, charging or the like of the bit line BL. For example, "H" is latched in the latch circuit SDL in FIG. 6, and the signal lines STB, XXL, BLC, BLS, HLL, and BLX are brought into states of "L, L, H, H, H, H". Accordingly, the voltage $V_{DD}$ is supplied to the bit line BL and the sense node SEN, and charging of these is started. For example, the voltage $V_{SRC}$ is supplied to the source line SL (FIG. 5), and charging of this is started. The voltage $V_{SRC}$ has, for example, a magnitude similar to the ground voltage $V_{SS}$. The voltage $V_{SRC}$ is larger than, for example, the ground voltage $V_{SS}$, and is smaller than the voltage $V_{DD}$.

For example, as illustrated in FIG. 11, the plurality of selected memory cells MC is allowed to be conductive with the bit lines BL and the source line SL. For example, a voltage $V_{SG}$ is supplied to the select gate lines SGD, SGS0, and SGSb, so that the select transistors STD, STS, and STSb are turned ON. The read pass voltage $V_{READ}$ is supplied to the non-selected word lines $WL_U$, so that all memory cells MC connected to the non-selected word lines $WL_U$ are turned ON.

As illustrated in FIG. 11, any of read voltages $V_{CGSR}$ (any of the read voltages $V_{CGS1R}$ to $V_{CGS15R}$ in FIG. 9) corresponding to data to be read is supplied to the selected word line $WL_S$. Accordingly, a memory cell MC corresponding to one state in FIG. 9 is turned ON, and a memory cell MC corresponding to another state is turned OFF.

The sense amplifier module SAM (FIG. 5) detects the ON/OFF state of the selected memory cells MC. For example, the wiring LBUS is charged via the charging transistor 55 in FIG. 6. The states of the signal lines STB, XXL, BLC, BLS, HLL, and BLX are set as "L, H, H, H, L, H", and electric charges in the sense node SEN are released to the bit line BL. Here, the voltage of the sense node SEN connected to the bit line BL corresponding to the memory cell MC in the ON state is reduced by a relatively large amount. Meanwhile, the voltage of the sense node SEN connected to the bit line BL corresponding to the memory cell MC in the OFF state is not reduced as much. Therefore, at a predetermined timing, the signal line STB is set as the "H" state, and electric charges in the wiring LBUS are released or maintained, so that the signal line STL is brought into the "H" state. Then, data indicating the state of the selected memory cell MC is latched in the latch circuit SDL. This data may be latched in any of the latch circuits DL other than the latch circuit SDL.

When a read operation by a plurality of read voltages $V_{CGSR}$ is required, as necessary, supplying a read voltage $V_{CGSR}$ to the selected word line $WL_S$, detecting the ON/OFF state of the selected memory cells MC, and latching the detected data are repeatedly performed several times. An arithmetic processing is performed on the latched data, thereby calculating the data D01 in FIG. 10.

Then, the data D01 (FIG. 10) is output according to the command C04 described with reference to FIG. 10. For example, the data D01 detected and calculated by the sense amplifier module SAM is transferred to the control die CD (FIG. 1) via the cache memory CM (FIG. 4), the bus DB, and the input/output control circuit I/O.

[Write Sequence]

Next, a write sequence of the semiconductor storage device will be described with reference to FIGS. 12 to 17.

Figure 12:
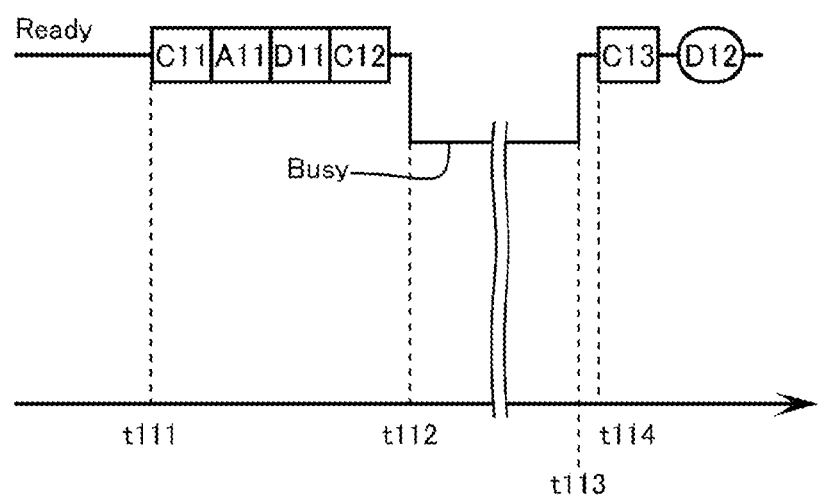
FIG. 12 is a schematic waveform diagram illustrating a write sequence.

FIG. 12 is a schematic waveform diagram illustrating the write sequence. A signal waveform illustrated in FIG. 12 indicates a signal of the terminal RY//BY (FIG. 4) of the memory die MD.

At the timing t111, the terminal RY//BY (FIG. 4) of the memory die MD is in the "H" state. At the timing t111, the control die CD inputs a command C11 to the memory die MD, inputs an address A11, inputs data D11, and then inputs a command C12. The commands C11 and C12 are commands to execute and start a write sequence, respectively. The input of the commands C11 and C12 is performed in the same manner as the input of the command C01. The input of the address A11 is performed in the same manner as the input of the address A01. When the data D11 is input, for example, 8-bit data in the data D11 is sequentially set in the data signal input/output terminals DQ0 to DQ7, and "L, L, L" are set in the external control terminals /CEn, CLE, and ALE. In this state, the L state of the external control terminal /WE is raised to the H state many times. Accordingly, the data D11 is latched in the cache memory CM, as the data DAT (FIG. 4).

At the timing t112, the write sequence by the memory die MD is started and the terminal RY//BY (FIG. 4) of the memory die MD enters into the "L" state.

At the timing t113, the write sequence by the memory die MD is ended, and the terminal RY//BY (FIG. 4) of the memory die MD enters into the "H" state.

At the timing t114, the control die CD inputs a command C13 to the memory die MD. The command C13 is a command to output status data. The input of the command C13 is performed in the same manner as the input of the command C01. Next, the control die CD reads data D12 from the memory die MD. The data D12 is, for example, the status data $D_{ST}$ (FIG. 4). Reading of the data D12 is performed in the same manner as reading of the data D01.

Figure 13:
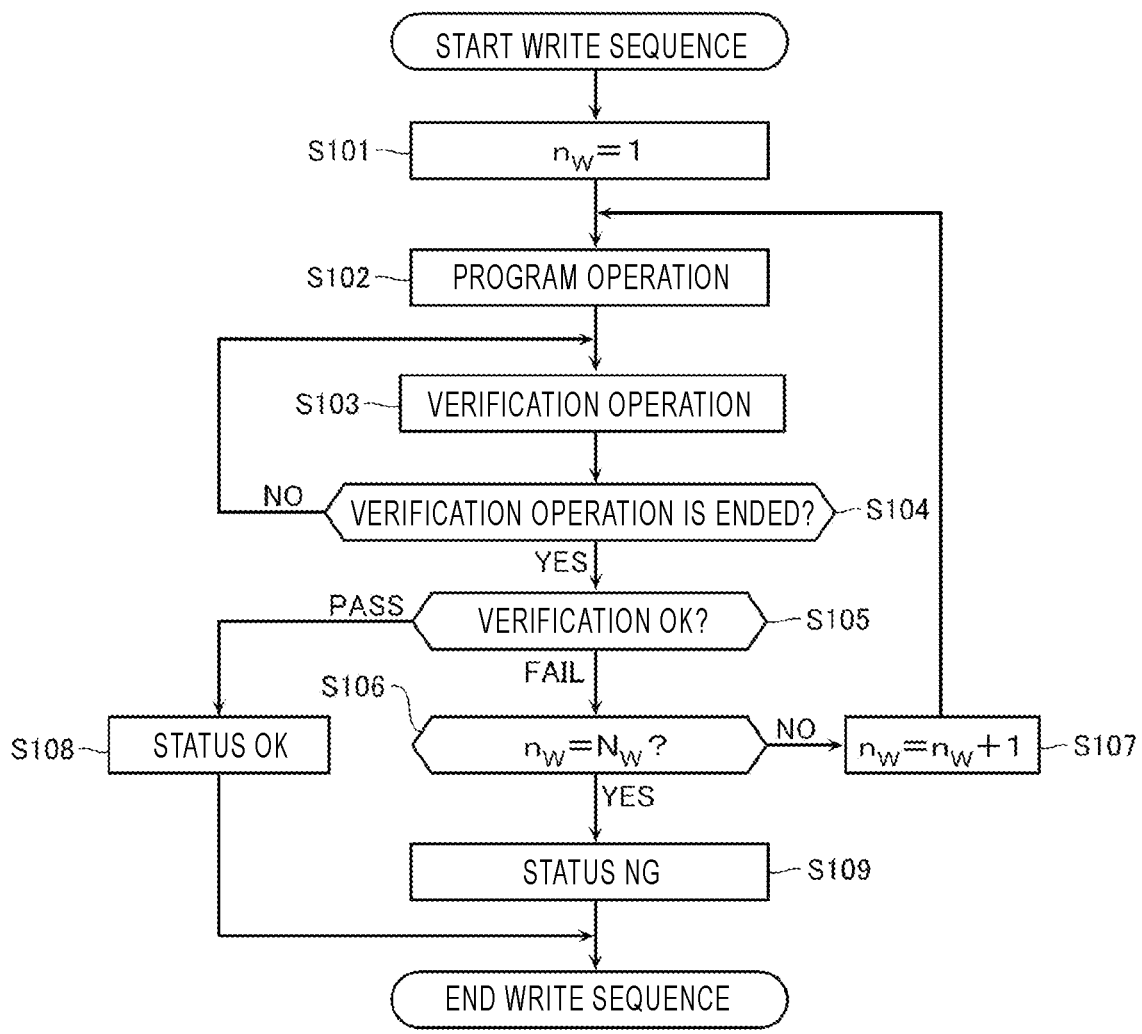
FIG. 13 is a schematic flowchart illustrating the write sequence.
Figure 14:
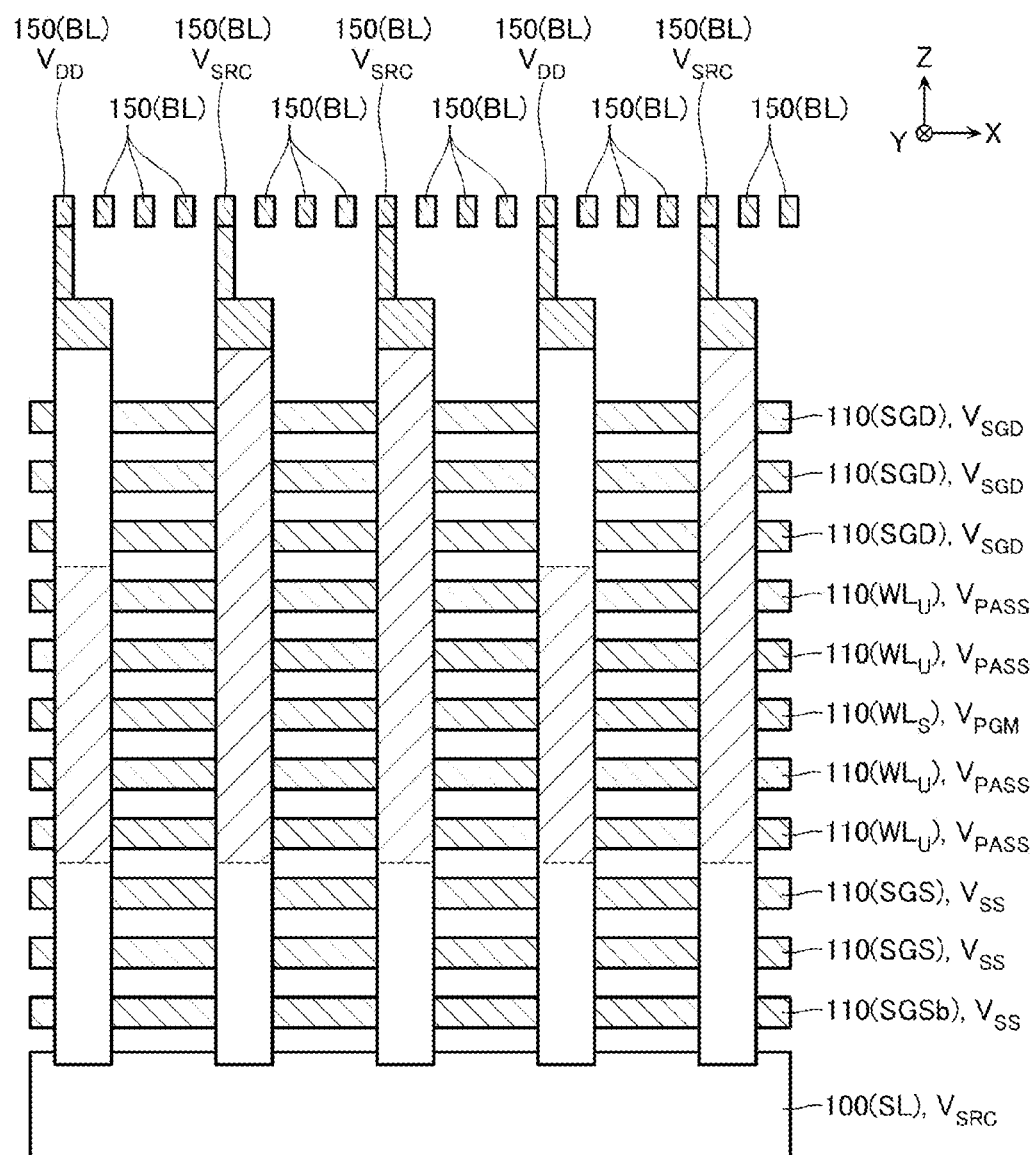
FIG. 14 is a schematic sectional view illustrating a program operation.
Figure 15:
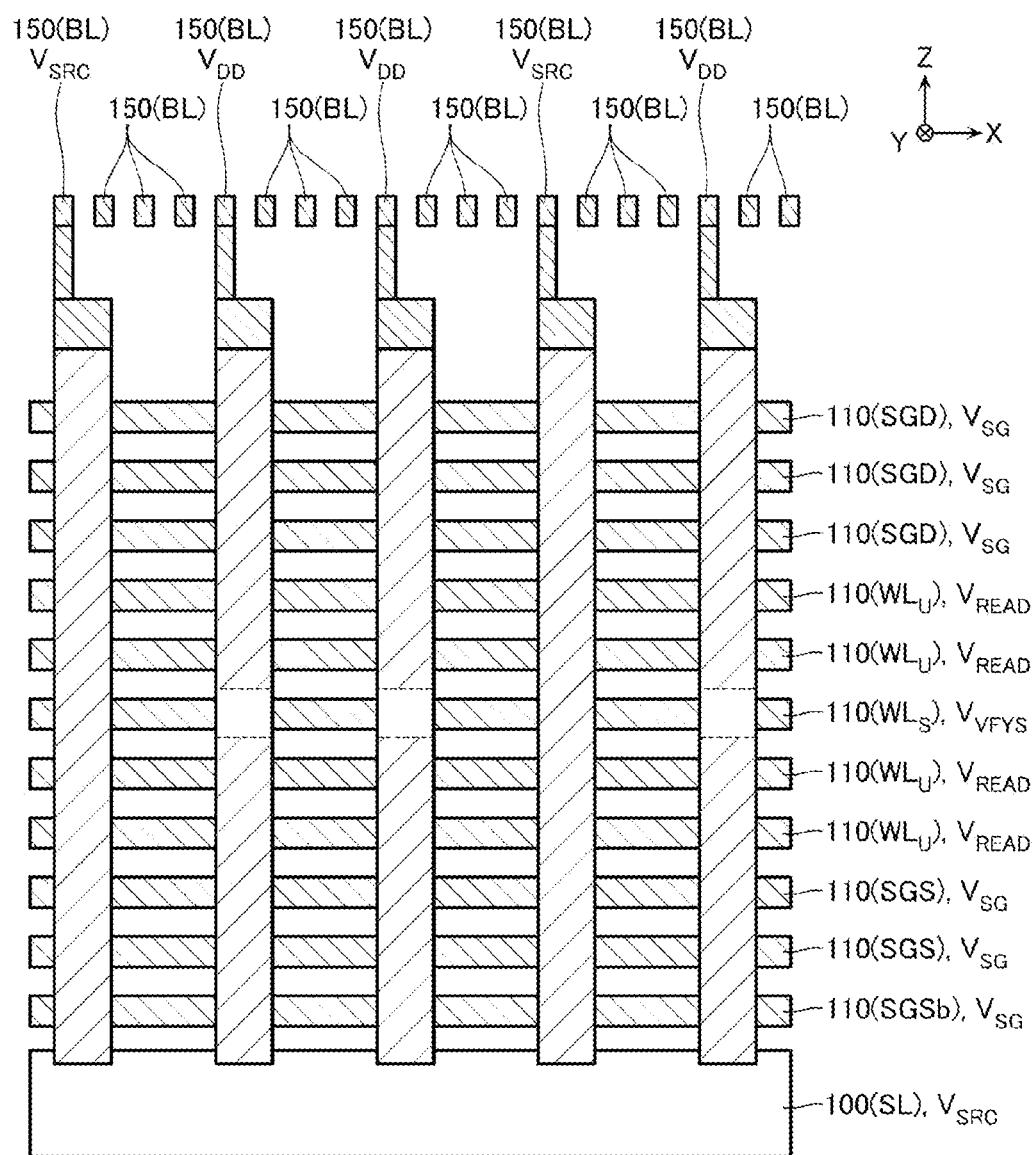
FIG. 15 is a schematic sectional view illustrating a verification operation.
Figure 16:
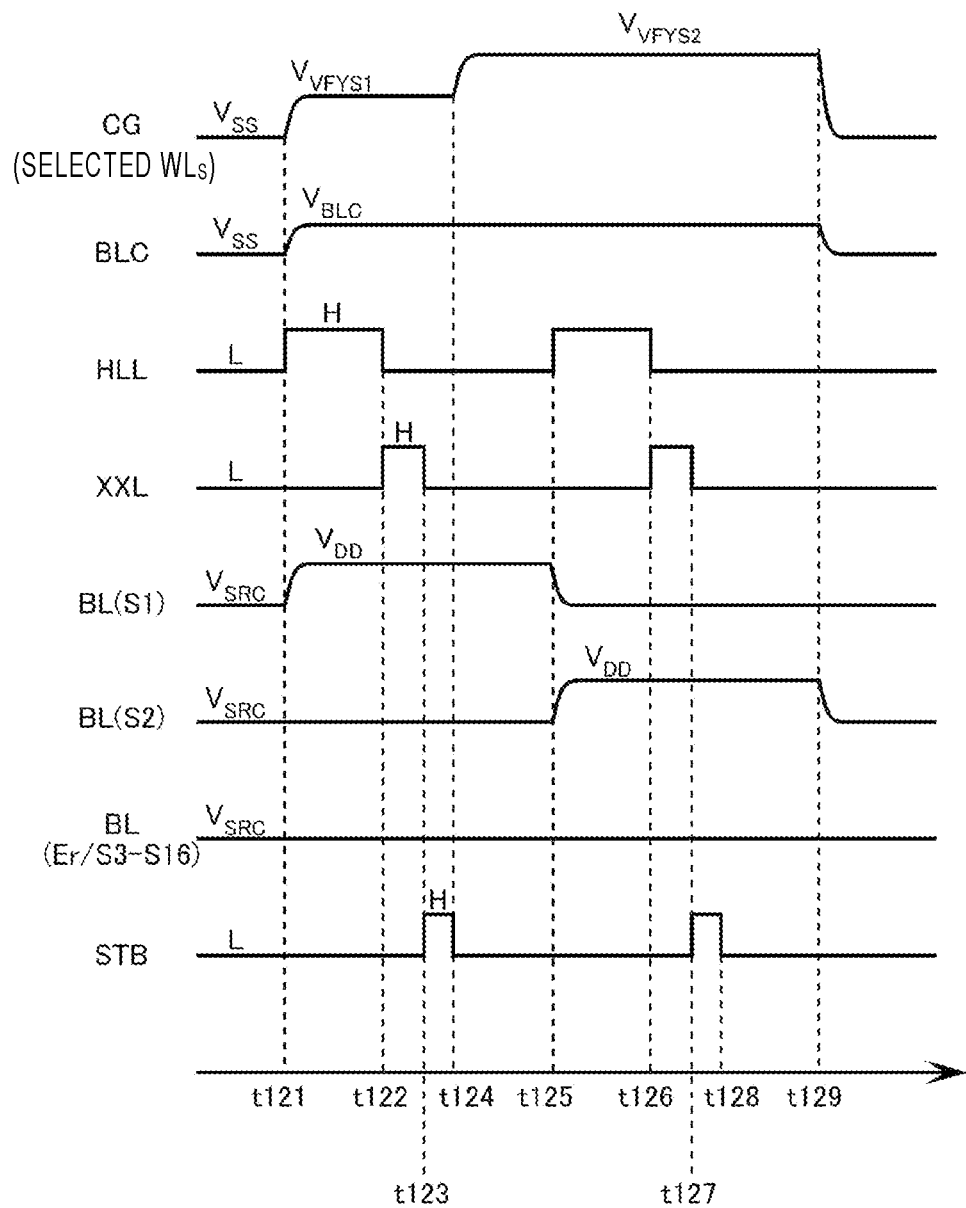
FIG. 16 is a schematic waveform diagram illustrating the verification operation.
Figure 17:
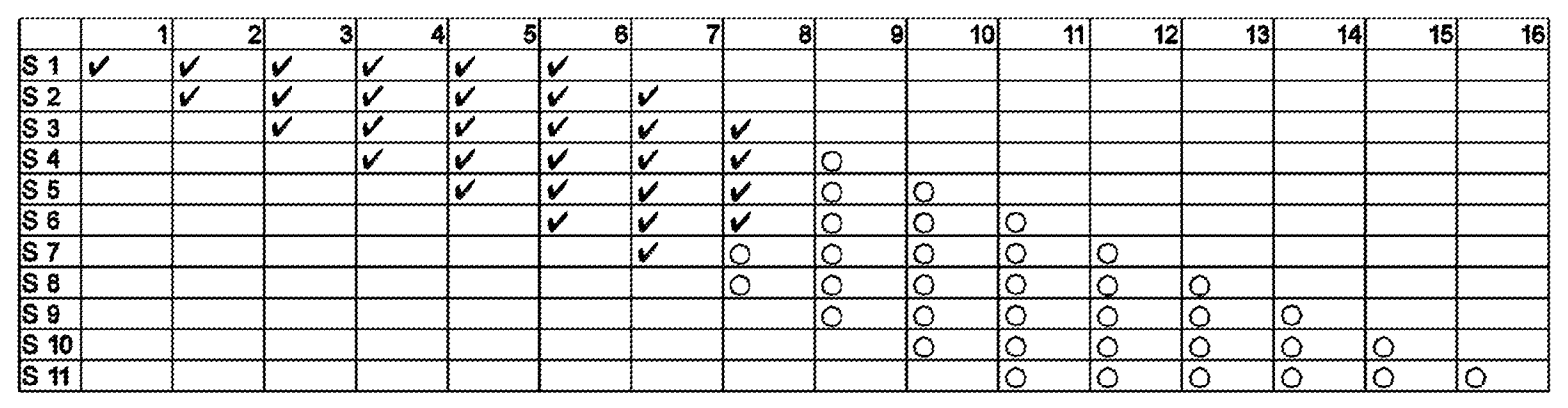

FIG. 13 is a schematic flowchart illustrating the write sequence. FIG. 14 is a schematic sectional view illustrating a program operation in the write sequence. FIG. 15 is a schematic sectional view illustrating a verification operation in the write sequence. FIG. 16 is a schematic waveform diagram illustrating the verification operation. FIG. 17 is a schematic table illustrating the verification operation, and illustrates which of the states S1 to S11 corresponds to the verification operation executed in each write loop. In the table exemplified in FIG. 17, only parts corresponding to the states S1 to S11 are illustrated, and parts corresponding to the states S12 to S15 are omitted.

In step S101 (FIG. 13), the number of loops nW is set as 1. The number of loops nW is stored in a register or the like. In step S101, 4-bit data corresponding to data to be written on each memory cell MC may be latched in the plurality of latch circuits DL within the sense amplifier unit SAU.

In step S102, a program operation is performed.

At the program operation, for example, as illustrated in FIG. 14, among selected memory cells MC, one for which a threshold voltage is to be adjusted (hereinafter, referred to as a "write memory cell MC" in some cases) is distinguished from one for which a threshold voltage is not to be adjusted (hereinafter, referred to as a "protected memory cell MC" in some cases). The distinguishing of the memory cells may be performed on the basis of, for example, data latched in the plurality of latch circuits DL within the sense amplifier unit SAU (FIG. 6). The voltage $V_{SRC}$ is supplied to the bit line BL connected to the write memory cell MC, and the voltage $V_{DD}$ is supplied to the bit line BL connected to the protected memory cell MC. For example, "L" is latched in the latch circuit SDL (FIG. 6) corresponding to the write memory cell MC, and "H" is latched in the latch circuit SDL (FIG. 6) corresponding to the protected memory cell MC. The states of the signal lines STB, XXL, BLC, BLS, HLL, and BLX are set as "L, L, H, H, L, H".

The write memory cell MC is allowed to be conductive with the bit line BL, and the protected memory cell MC is disconnected from the bit line BL. For example, a voltage $V_{SGD}$ is supplied to the drain-side select gate line SGD. The voltage $V_{SGD}$ is smaller than, for example, the voltage $V_{SG}$ in FIG. 11. Accordingly, the drain-side select transistor STD corresponding to the bit line BL to which the voltage $V_{SRC}$ is supplied is turned ON, and the drain-side select transistor STD corresponding to the bit line BL to which the voltage $V_{DD}$ is supplied is turned OFF. A write pass voltage $V_{PASS}$ is supplied to the non-selected word lines $WL_U$. The write pass voltage $V_{PASS}$ is larger than, for example, the read pass voltage $V_{READ}$ in FIG. 11.

A program voltage $V_{PGM}$ is supplied to the selected word line $WL_S$. The program voltage $V_{PGM}$ is larger than the write pass voltage $V_{PASS}$. Accordingly, electrons are stored in the charge storage film 132 (FIG. 8) of a desired memory cell MC, and the threshold voltage of the desired memory cell MC is increased.

In step S103 (FIG. 13), a verification operation is performed. In step S104 (FIG. 13), it is determined whether to end the verification operation. When the verification operation is not ended, the process proceeds to step S103. When the verification operation is ended, the process proceeds to step S105.

For example, in the example of FIG. 16, at the timing t121, the verification operation (step S103) corresponding to the state S1 is started. Along with this, the verification voltage $V_{VFYS1}$ is supplied to the selected word line $WL_S$. The signal lines BLC, HLL, XXL, and STB (FIG. 6) are in states of "H, H, L, L". Along with this, the voltage $V_{DD}$ is supplied to the bit lines BL connected to the memory cells MC corresponding to the state S1, and the voltage $V_{SRC}$ is supplied to other bit lines BL. For example, as illustrated in FIG. 15, the selected memory cells MC are conductive with the bit lines BL and the source line SL.

At the timing t122, the signal lines BLC, HLL, XXL, and STB (FIG. 6) are in states of "H, L, H, L".

At the timing t123, the signal lines BLC, HLL, XXL, and STB (FIG. 6) enter into states of "H, L, L, H", and the ON/OFF state of the selected memory cell MC is detected so that data indicating the state of the selected memory cell MC is latched in any of the latch circuits DL.

At the timing t124, the verification operation (step S103) corresponding to the state S1 is ended, and the verification operation (step S103) corresponding to the state S2 is started because it is determined not to end verification operation in step S104. Along with this, the verification voltage $V_{VFYS2}$ is supplied to the selected word line $WL_S$. The signal lines BLC, HLL, XXL, and STB (FIG. 6) are in states of "H, L, L, L".

At the timing t125, the signal lines BLC, HLL, XXL, and STB (FIG. 6) are in states of "H, H, L, L". Along with this, the voltage $V_{DD}$ is supplied to the bit lines BL connected to the memory cells MC corresponding to the state S2, and the voltage $V_{SRC}$ is supplied to other bit lines B L.

At the timing t126, the signal lines BLC, HLL, XXL, and STB (FIG. 6) are in states of "H, L, H, L".

At the timing t127, the signal lines BLC, HLL, XXL, and STB (FIG. 6) enter into states of "H, L, L, H", and the ON/OFF state of the selected memory cell MC is detected so that data indicating the state of the selected memory cell MC is latched in any of the latch circuits DL.

At the timing t128, the signal lines BLC, HLL, XXL, and STB (FIG. 6) are in states of "H, L, L, L".

At the timing t129, the verification operation (step S103) corresponding to the state S2 is ended, and it is determined to end the verification operation in step S104. Along with this, the ground voltage $V_{SS}$ is supplied to the selected word line $WL_S$. The signal lines BLC, HLL, XXL, and STB (FIG. 6) are in states of "L, L, L, L".

In steps S103 and S104, it is determined whether each memory cell MC has reached a target threshold voltage on the basis of data indicating the state of the memory cell MC, the data being acquired at the timings t123, t127, etc. With respect to the memory cell MC that is determined to have reached the target threshold voltage, data within the plurality of latch circuits DL within the sense amplifier unit SAU corresponding to the memory cell MC is updated. For example, the data within the latch circuit DL is updated to a value indicating write protection. Accordingly, in the subsequent write loop, this memory cell MC is treated as a protected memory cell MC. With respect to the memory cell MC that is determined not to have reached the target threshold voltage, data within the plurality of latch circuits DL within the sense amplifier unit SAU corresponding to the memory cell MC is maintained.

The number of the verification operations executed in each write loop, or the like is adjusted according to the number of loops nW.

For example, in the example illustrated in FIG. 17, when the number of loops nW is 1, in steps S103 and S104, the verification operation corresponding to the state S1 is executed. In the verification operation corresponding to the state S1, for example, the bit line BL connected to the write memory cell MC corresponding to the state S1 is charged, and the verification voltage $V_{VFYS1}$ is supplied to the selected word line $WL_S$.

When the number of loops nW is 2, in steps S103 and S104, the verification operations corresponding to the states S1 and S2 are sequentially executed. In the verification operation corresponding to the state S2, for example, the bit line BL connected to the write memory cell MC corresponding to the state S2 is charged, and the verification voltage $V_{VFYS2}$ is supplied to the selected word line $WL_S$.

When the number of loops nW is 3, in steps S103 and S104, the verification operations corresponding to the states S1 to S3 are sequentially executed. In the verification operation corresponding to the state S3, for example, the bit line BL connected to the write memory cell MC corresponding to the state S3 is charged, and the verification voltage $V_{VFYS3}$ is supplied to the selected word line $WL_S$.

In step S105 (FIG. 13), the result of the verification operation is determined. For example, when the number of memory cells MC determined to have reached the target threshold voltage is less than a certain number, determination of verification FAIL is made, and the process proceeds to step S106. Meanwhile, when the number of memory cells MC determined to have reached the target threshold voltage is equal to or greater than a certain number, determination of verification PASS is made, and the process proceeds to step S108.

In step S106, it is determined whether the number of loops nW has reached a predetermined number of times NW. When the predetermined number of times NW is not reached, the process proceeds to step S107. When the predetermined number of times NW is reached, the process proceeds to step S109.

In step S107, 1 is added to the number of loops nW, and the process proceeds to step S102. In step S107, for example, a predetermined voltage ΔV is added to the program voltage $V_{PGM}$.

In step S108, status data $D_{ST}$ is stored to indicate that the write sequence has normally ended, in the status register STR (FIG. 2), and the write sequence is ended.

In step S109, status data $D_{ST}$ is stored to indicate that the write sequence has not normally ended, in the status register STR (FIG. 2), and the write sequence is ended.

[Interruption and Resumption of Write Sequence]

Next, descriptions will be made on interruption and resumption of the write sequence of the semiconductor storage device, with reference to FIGS. 18 to 20.

Figure 18:
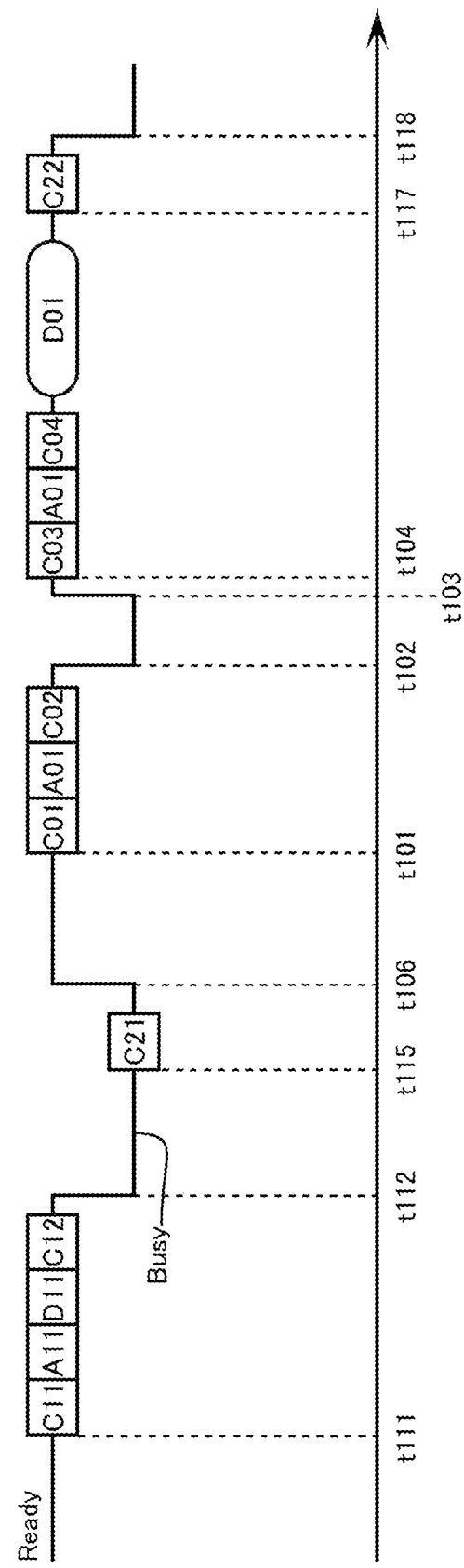
FIG. 18 is a schematic waveform diagram illustrating interruption and resumption of the write sequence.

FIG. 18 is a schematic waveform diagram illustrating interruption and resumption of the write sequence. The signal waveform illustrated in FIG. 18 indicates a signal of the terminal RY//BY (FIG. 4) of the memory die MD.

In the example of FIG. 18, at the timing t115 during execution of a write operation, the control die CD inputs a command C21 to the memory die MD. The command C21 is a command to interrupt the write operation. The input of the command C21 is performed in the same manner as the input of the command COL In the example of FIG. 18, the write operation is interrupted at the subsequent timing t106, and the terminal RY//BY (FIG. 4) of the memory die MD enters into the "H" state.

In the example of FIG. 18, subsequently, the read operation described with reference to FIGS. 10 and 11 is executed.

In the example of FIG. 18, at the subsequent timing t117, the control die CD inputs a command C22 to the memory die MD. The command C22 is a command to resume the write operation. The input of the command C22 is performed in the same manner as the input of the command C01.

In the example of FIG. 18, at the subsequent timing t118, the write operation is resumed.

Next, with reference to FIGS. 19 and 20, descriptions will be made on a voltage supplied to the selected word line $WL_S$ when the write sequence is interrupted and resumed, or the like. FIGS. 19 and 20 illustrate an example in which the number of loops nW in FIG. 13 is 8, and the verification operation is executed 6 times as illustrated in FIG. 17.

First, for comparison, descriptions will be made on an example where the write sequence is not interrupted, with reference to FIG. 19.

Figure 19:
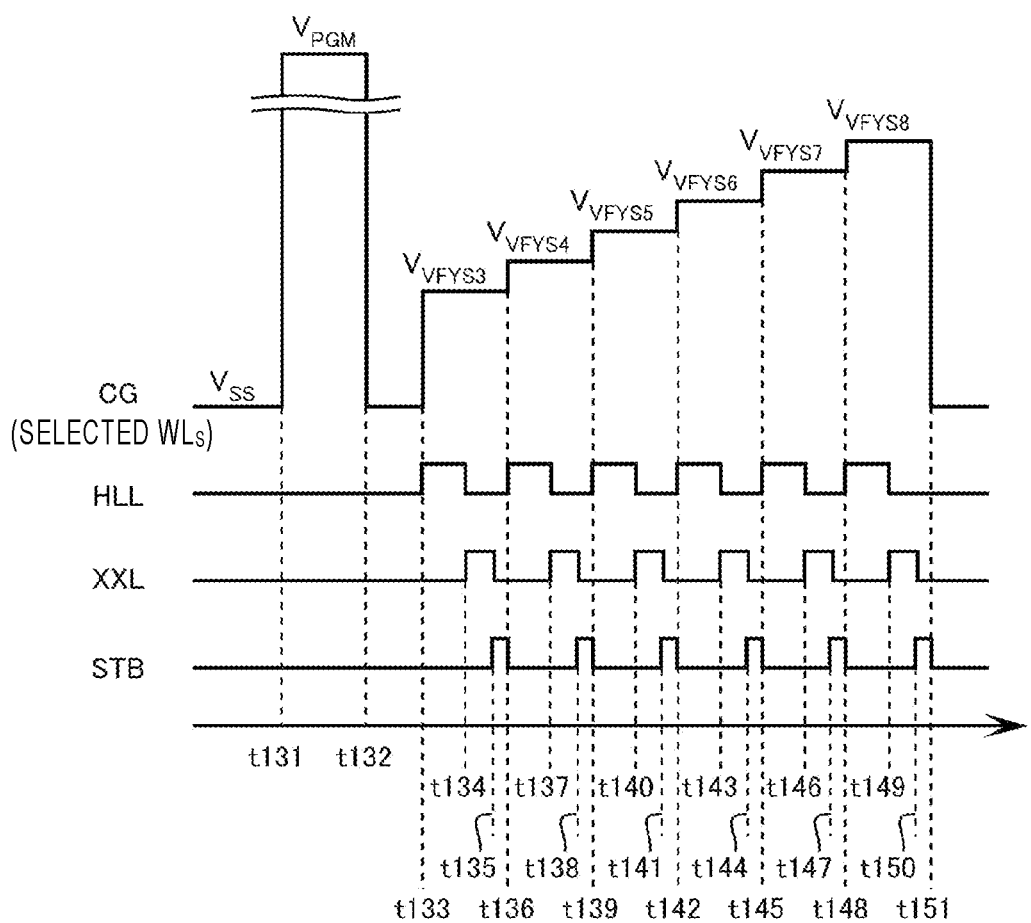
FIG. 19 is a schematic waveform diagram illustrating interruption and resumption of the write sequence.

In the example illustrated in FIG. 19, at the timing t131, the program operation is started. That is, the program voltage $V_{PGM}$ is supplied to the selected word line $WL_S$. The signal lines HLL, XXL, and STB (FIG. 6) enter into states of "L, L, L".

At the timing t132, the program operation is ended. That is, the ground voltage $V_{SS}$ is supplied to the selected word line $WL_S$. The signal lines HLL, XXL, and STB (FIG. 6) enter into states of "L, L, L".

At the timing t133, the verification operation corresponding to the state S3 is started. That is, the verification voltage $V_{VFYS3}$ is supplied to the selected word line $WL_S$. The signal lines HLL, XXL, and STB (FIG. 6) enter into states of "H, L, L".

At the timing t134, the signal lines HLL, XXL, and STB (FIG. 6) enter into states of "L, H, L".

At the timing t135, the signal lines HLL, XXL, and STB (FIG. 6) enter into states of "L, L, H".

At the timing t136, the verification operation corresponding to the state S3 is ended, and the verification operation corresponding to the state S4 is started. That is, the verification voltage $V_{VFYS4}$ is supplied to the selected word line $WL_S$. The signal lines HLL, XXL, and STB (FIG. 6) enter into states of "H, L, L".

At the timing t137, the signal lines HLL, XXL, and STB (FIG. 6) enter into states of "L, H, L".

At the timing t138, the signal lines HLL, XXL, and STB (FIG. 6) enter into states of "L, L, H".

At the timing t139, the verification operation corresponding to the state S4 is ended, and the verification operation corresponding to the state S5 is started. That is, the verification voltage $V_{VFYS5}$ is supplied to the selected word line $WL_S$. The signal lines HLL, XXL, and STB (FIG. 6) enter into states of "H, L, L".

At the timing t140, the signal lines HLL, XXL, and STB (FIG. 6) enter into states of "L, H, L".

At the timing t141, the signal lines HLL, XXL, and STB (FIG. 6) enter into states of "L, L, H".

At the timing t142, the verification operation corresponding to the state S5 is ended, and the verification operation corresponding to the state S6 is started. That is, the verification voltage $V_{VFYS6}$ is supplied to the selected word line $WL_S$. The signal lines HLL, XXL, and STB (FIG. 6) enter into states of "H, L, L".

At the timing t143, the signal lines HLL, XXL, and STB (FIG. 6) enter into states of "L, H, L".

At the timing t144, the signal lines HLL, XXL, and STB (FIG. 6) enter into states of "L, L, H".

At the timing t145, the verification operation corresponding to the state S6 is ended, and the verification operation corresponding to the state S7 is started. That is, the verification voltage $V_{VFYS7}$ is supplied to the selected word line $WL_S$. The signal lines HLL, XXL, and STB (FIG. 6) enter into states of "H, L, L".

At the timing t146, the signal lines HLL, XXL, and STB (FIG. 6) enter into states of "L, H, L".

At the timing t147, the signal lines HLL, XXL, and STB (FIG. 6) enter into states of "L, L, H".

At the timing t148, the verification operation corresponding to the state S7 is ended, and the verification operation corresponding to the state S8 is started. That is, the verification voltage $V_{VFYS8}$ is supplied to the selected word line $WL_S$. The signal lines HLL, XXL, and STB (FIG. 6) enter into states of "H, L, L".

At the timing t149, the signal lines HLL, XXL, and STB (FIG. 6) enter into states of "L, H, L".

At the timing t150, the signal lines HLL, XXL, and STB (FIG. 6) enter into states of "L, L, H".

At the timing t151, the verification operation corresponding to the state S8 is ended. That is, the ground voltage $V_{SS}$ is supplied to the selected word line $WL_S$. The signal lines HLL, XXL, and STB (FIG. 6) enter into states of "L, L, L".

Next, descriptions will be made on an example where the write sequence is interrupted and resumed, with reference to FIG. 20. In the semiconductor storage device according to the present embodiment, after a $k^{th}$ (k is a natural number less than m) verification operation of the write sequence is ended, when the write sequence is interrupted before a k+1$^{th}$ verification operation is ended, a dummy verification operation corresponding to the $k^{th}$ verification operation is executed after resumption of the write sequence, and then, the k+1$^{th}$ verification operation and a subsequent operation are executed. FIGS. 17 and 20 illustrate an example where k=4. In FIG. 17, the verification operation corresponding to a check mark corresponds to a verification operation which is already executed, and the verification operation corresponding to a circle corresponds to a verification operation which is not yet executed. In the example of FIG. 17, the state where the number of loops nW is 8, and k=4 corresponds to a state where four verification operations corresponding to the states S3 to S6 are executed, and two verification operations corresponding to the states S7 and S8 are not executed.

The dummy verification operation may be executed in the same manner as the verification operation. Meanwhile, during the dummy verification operation, the above-described data indicating whether the selected memory cell MC is in the ON state or the OFF state may not be latched in the latch circuit. During the dummy verification operation, a voltage may be supplied to the bit line BL, or a voltage may not be supplied to the bit line BL. During the dummy verification operation, the sense amplifier module SAM may be operated in the same manner as during the verification operation, and all or part of the sense amplifier module SAM may not be operated.

Figure 20:
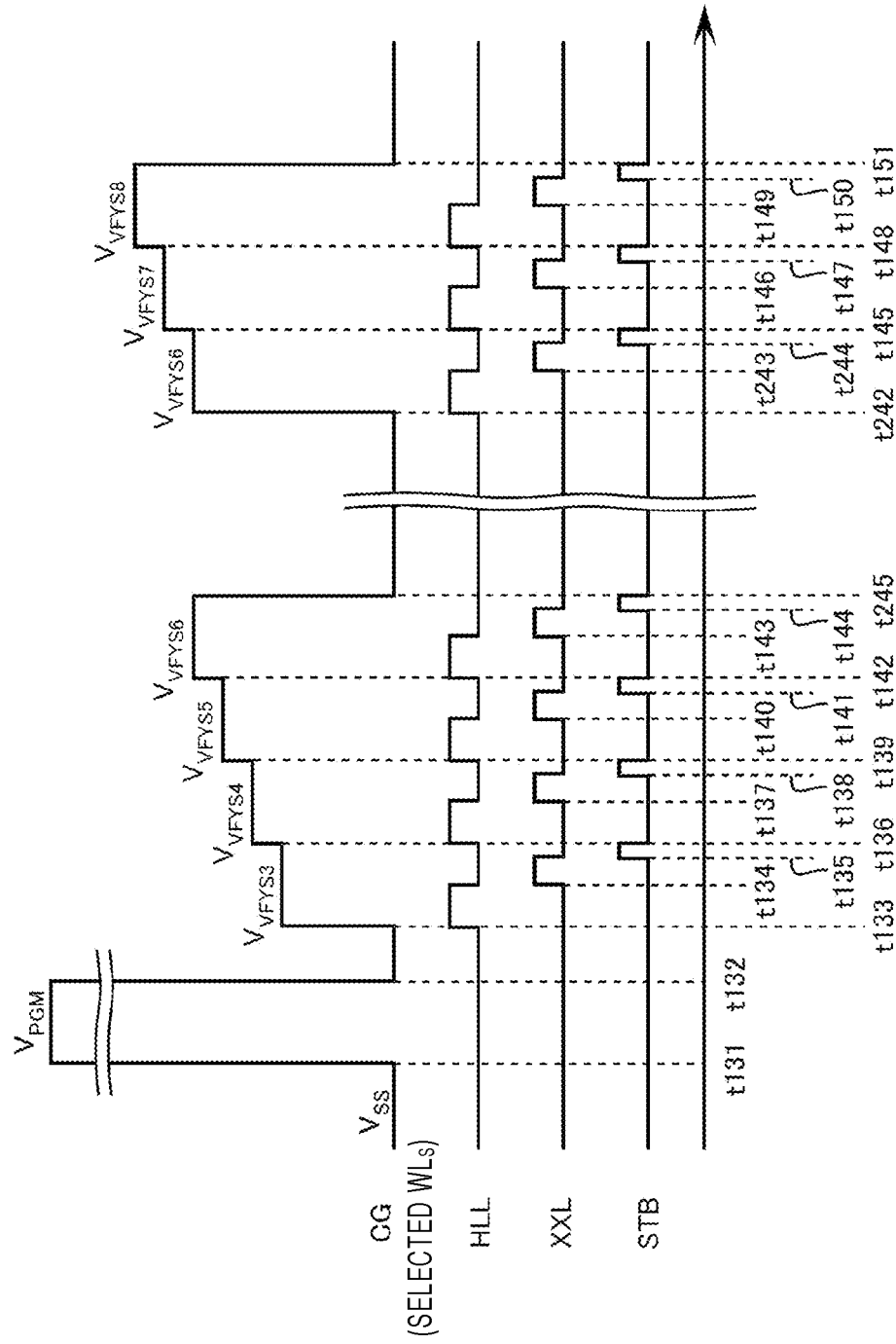
FIG. 20 is a schematic waveform diagram illustrating interruption and resumption of the write sequence.

In the example illustrated in FIG. 20, from the timing t131 to the timing t144, the write sequence is executed in the same manner as in the example illustrated in FIG. 19.

At the timing t245, the verification operation corresponding to the state S6 is ended, and then the write sequence is interrupted. That is, the ground voltage $V_{SS}$ is supplied to the selected word line $WL_S$. The signal lines HLL, XXL, and STB (FIG. 6) enter into states of "L, L, L".

At the timing t242, the write sequence is resumed, and a dummy verification operation corresponding to the state S6 is started. That is, the verification voltage $V_{VFYS6}$ is supplied to the selected word line $WL_S$ to which the ground voltage $V_{SS}$ was supplied. The signal lines HLL, XXL, and STB (FIG. 6) enter into states of "H, L, L".

At the timing t243, the signal lines HLL, XXL, and STB (FIG. 6) enter into states of "L, H, L".

At the timing t244, the signal lines HLL, XXL, and STB (FIG. 6) enter into states of "L, L, H".

Next, the dummy verification operation corresponding to the state S6 is ended, and after the timing t145 in the write sequence, corresponding operations are executed.

First Comparative Example

Next, descriptions will be made on interruption and resumption of the write sequence of the semiconductor storage device according to a comparative example, with reference to FIG. 21.

In the semiconductor storage device according to a first comparative example, after a $k^{th}$ verification operation of the write sequence is ended, when the write sequence is interrupted before a k+1$^{th}$ verification operation is ended, dummy verification operations corresponding to first to $k^{th}$ verification operations are sequentially executed after resumption of the write sequence, and then, the k+1$^{th}$ verification operation and a subsequent operation are executed. FIG. 21 illustrates an example where k=4.

Figure 21:
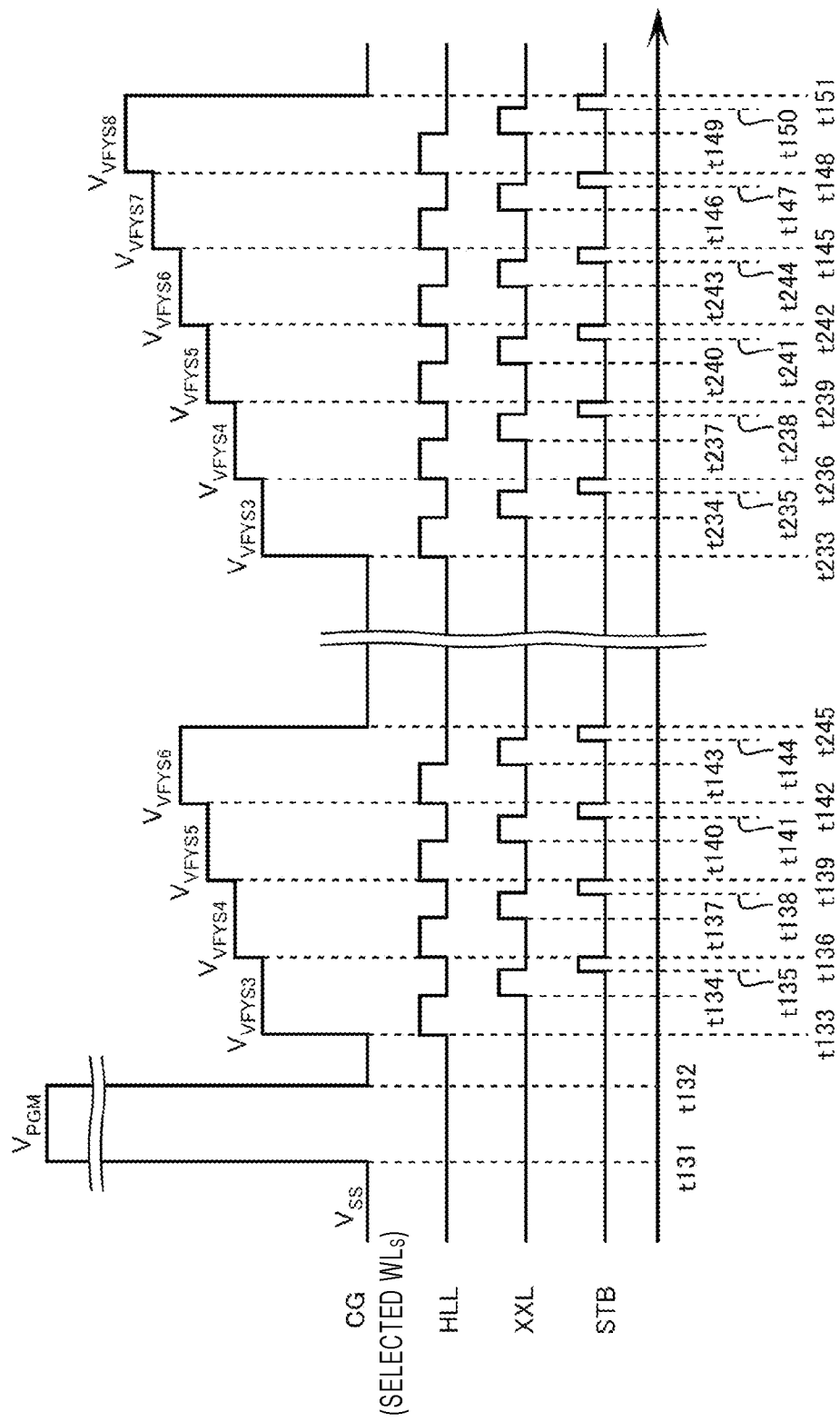
FIG. 21 is a schematic waveform diagram illustrating interruption and resumption of a write sequence according to a first comparative example.

In the example illustrated in FIG. 21, from the timing t131 to the timing t144, the write sequence is executed in the same manner as in the example illustrated in FIG. 19.

At the timing t245, the verification operation corresponding to the state S6 is ended, and then the write sequence is interrupted. That is, the ground voltage $V_{SS}$ is supplied to the selected word line $WL_S$. The signal lines HLL, XXL, and STB (FIG. 6) enter into states of "L, L, L".

At the timing t233, the write sequence is resumed. From the timing t233 to the timing t145, dummy verification operations corresponding to the states S3 to S6 are executed.

Then, after the timing t145 in the write sequence, corresponding operations are executed.

Second Comparative Example

Next, descriptions will be made on interruption and resumption of the write sequence of the semiconductor storage device according to a comparative example, with reference to FIG. 22.

In the semiconductor storage device according to a second comparative example, after a $k^{th}$ verification operation of the write sequence is ended, when the write sequence is interrupted before a k+1$^{th}$ verification operation is ended, a dummy verification operation is not executed after resumption of the write sequence, and the k+1$^{th}$ verification operation and a subsequent operation are executed immediately after resumption of the write sequence. FIG. 22 illustrates an example where k=4.

Figure 22:
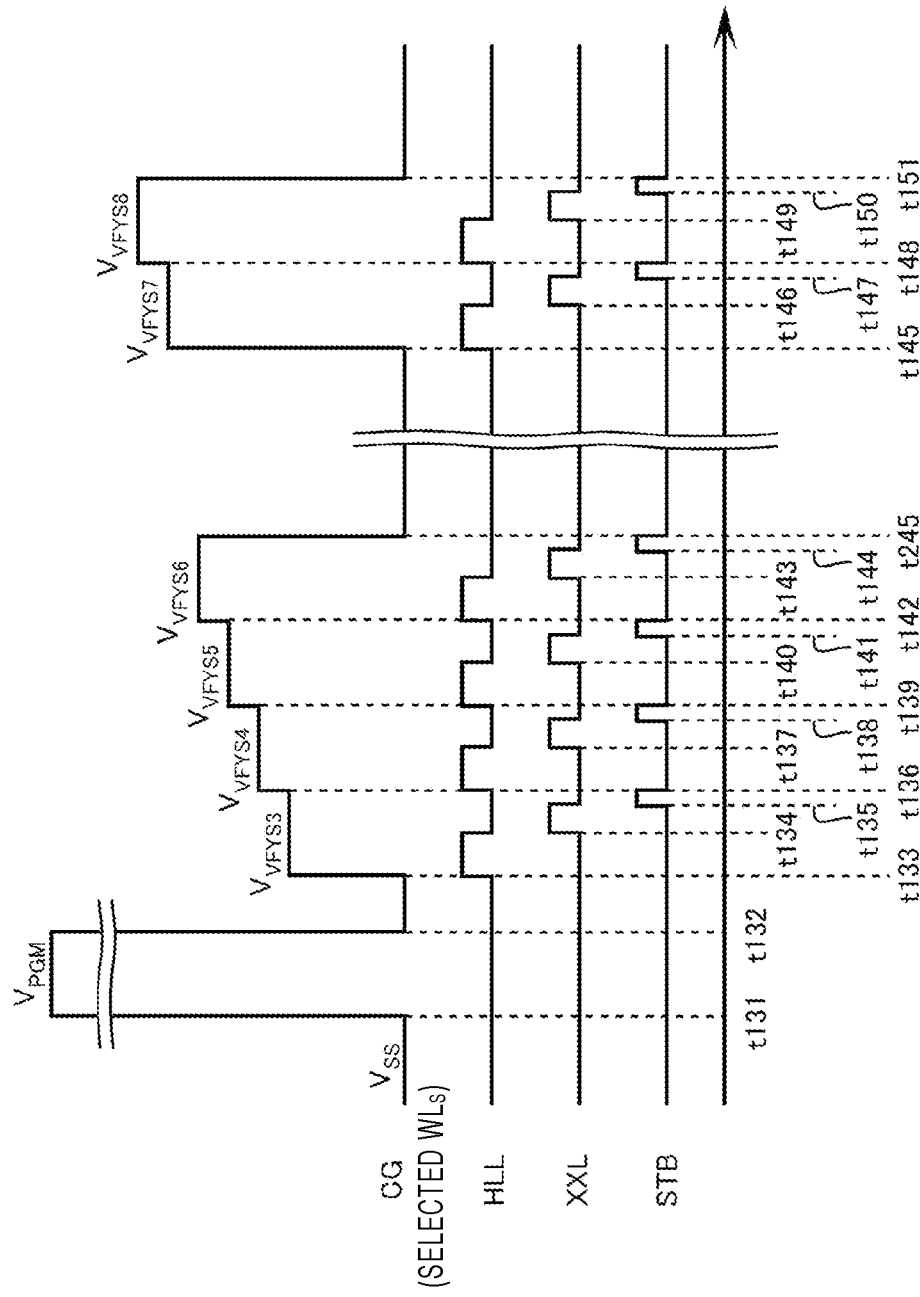
FIG. 22 is a schematic waveform diagram illustrating interruption and resumption of a write sequence according to a second comparative example.

In the example illustrated in FIG. 22, from the timing t131 to the timing t144, the write sequence is executed in the same manner as in the example illustrated in FIG. 19.

At the timing t245, the verification operation corresponding to the state S6 is ended, and the write sequence is interrupted. That is, the ground voltage $V_{SS}$ is supplied to the selected word line $WL_S$. The signal lines HLL, XXL, and STB (FIG. 6) enter into states of "L, L, L".

At the timing t145, the write sequence is resumed, and after the timing t145 in the write sequence, corresponding operations are executed.

Effect of First Embodiment

As described above, in the semiconductor storage device according to the first comparative example, after the $k^{th}$ verification operation of the write sequence is ended, when the write sequence is interrupted before the k+1$^{th}$ verification operation is ended, dummy verification operations corresponding to the first to $k^{th}$ verification operations are executed after resumption of the write sequence, and then, the $k+1^{th}$ verification operation and the subsequent operation are executed.

In this method, it takes a long time until arrival at the $k+1^{th}$ verification operation after resumption of the write sequence (the time from the timing t233 to the timing t145 in FIG. 21), which may hinder speeding-up of the write sequence.

Therefore, as described above, in the semiconductor storage device according to the second comparative example, after the $k^{th}$ verification operation of the write sequence is ended, when the write sequence is interrupted before the $k+1^{th}$ verification operation is ended, a dummy verification operation is not executed after resumption of the write sequence, and the $k+1^{th}$ verification operation and the subsequent operation are executed immediately after resumption of the write sequence.

In this method, since the $k+1^{th}$ verification operation is started immediately after resumption of the write sequence, it is possible to implement the speeding-up of the write sequence.

However, in such a method, as compared to that in the method according to the first comparative example, the reliability of the verification operation executed immediately after resumption of the write sequence may be reduced. This may be thought to be caused by the following phenomenon.

That is, as the semiconductor storage device has become highly integrated, a film thickness of the conductive layer 110 functioning as the word line WL is becoming smaller, and the resistance of the conductive layer 110 is increasing. A distance between the conductive layers 110 in the Z direction is becoming shorter, and the capacitance in the conductive layer 110 is also increasing. As a result, the time constant in the conductive layer 110 is increasing, and a time until voltages of the entire word line WL reach a voltage supplied to the word line WL is increasing.

When the verification operation is executed in such a state, for example, it is possible to consider that a voltage is supplied to the word line WL until voltages of the entire word line WL are saturated, and then in this state, data indicating whether the memory cell MC is turned ON or turned OFF is acquired. However, in such a method, the time required for the verification operation is prolonged, which may hinder the speeding-up of the write sequence. Therefore, in order to implement the speeding-up of the write sequence, it is possible to consider that, for example, the data is acquired before voltages of the entire word line WL are saturated.

Here, in the first comparative example, regardless of whether the write sequence is interrupted or not, the verification voltage $V_{VFYS6}$ is supplied to the selected word line $WL_S$ immediately before the $k+1^{th}$ verification operation, and at the $k+1^{th}$ verification operation, the verification voltage $V_{VFYS7}$ is supplied to the selected word line $WL_S$. Therefore, it may be thought that the voltage of the selected word line $WL_S$ at the $k+1^{th}$ verification operation has a similar magnitude regardless of whether the write sequence is interrupted or not.

Meanwhile, in the second comparative example, when the write sequence is interrupted, the ground voltage $V_{SS}$ is supplied to the selected word line $WL_S$ immediately before the $k+1^{th}$ verification operation, and the verification voltage $V_{VFYS7}$ is supplied to the selected word line $WL_S$ at the $k+1^{th}$ verification operation. Therefore, it may be thought that the voltage of the selected word line $WL_S$ at the $k+1^{th}$ verification operation when the write sequence is interrupted becomes smaller than the voltage of the selected word line $WL_S$ at the $k+1^{th}$ verification operation when the write sequence is not interrupted.

Here, as described above, in the semiconductor storage device according to the first embodiment, after the $k^{th}$ verification operation of the write sequence is ended, when the write sequence is interrupted before the $k+1^{th}$ verification operation is ended, a dummy verification operation corresponding to the $k^{th}$ verification operation is executed after resumption of the write sequence, and then, the $k+1^{th}$ verification operation and the subsequent operation are executed.

In this method, the time until arrival at the $k+1^{th}$ verification operation after resumption of the write sequence (the time from the timing t242 to the timing t145 in FIG. 20) is shorter than that in the first comparative example.

In this method, the verification voltage $V_{VFYS6}$ is supplied to the selected word line $WL_S$ immediately before the $k+1^{th}$ verification operation, and the verification voltage $V_{VFYS7}$ is supplied to the selected word line $WL_S$ at the $k+1^{th}$ verification operation. Therefore, it may be thought that the voltage of the selected word line $WL_S$ at the $k+1^{th}$ verification operation has a similar magnitude regardless of whether the write sequence is interrupted or not.

Therefore, according to the semiconductor storage device according to the first embodiment, it is possible to achieve the speeding-up of the write sequence without lowering the reliability of the write sequence.

Second Embodiment

Next, a semiconductor storage device according to a second embodiment will be described with reference to FIG. 23. The semiconductor storage device according to the second embodiment is configured in basically the same manner as the semiconductor storage device according to the first embodiment. Meanwhile, the semiconductor storage device according to the second embodiment is different from the semiconductor storage device according to the first embodiment in an operation executed after write sequence resumption subsequent to write sequence interruption.

In the semiconductor storage device according to the second embodiment, after a $k^{th}$ verification operation of the write sequence is ended, when the write sequence is interrupted before a $k+1^{th}$ verification operation is ended, dummy verification operations corresponding to $k-1^{th}$ and $k^{th}$ verification operations are sequentially executed after resumption of the write sequence, and then, the $k+1^{th}$ verification operation and a subsequent operation are executed. FIG. 23 illustrates an example where k=4.

In the example illustrated in FIG. 23, the write sequence and the read operation are basically executed in the same manner as the operations described with reference to FIG. 20.

Figure 23:
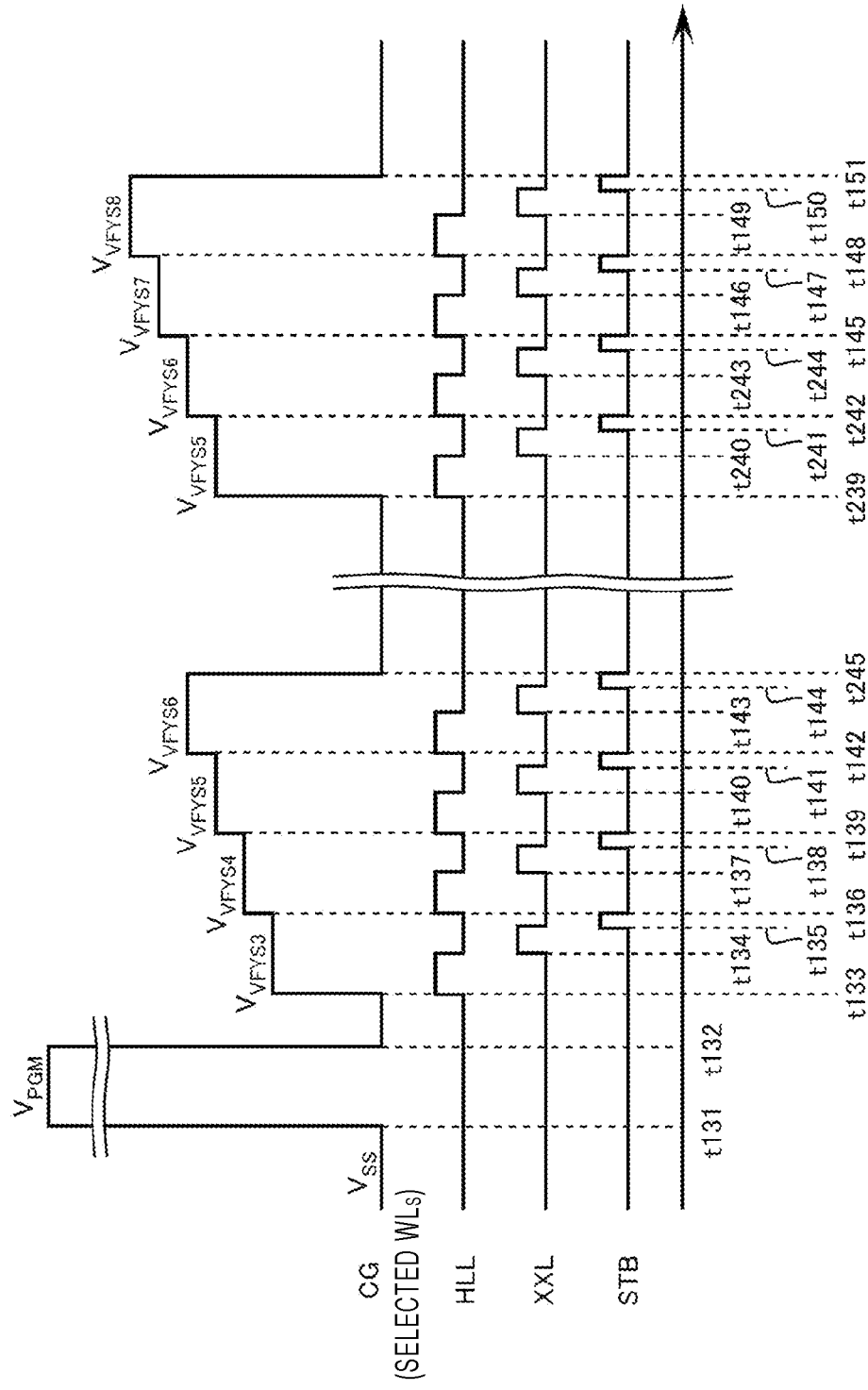
FIG. 23 is a schematic waveform diagram illustrating interruption and resumption of a write sequence according to a second embodiment.

Meanwhile, in the example illustrated in FIG. 23, the write sequence is resumed at the timing t239 instead of the timing t242.

From the timing t239 when the write sequence is resumed, to the timing t145 when the verification operation corresponding to the state S7 is started, dummy verification operations corresponding to the states S5 and S6 are sequentially executed.

Third Embodiment

Next, a semiconductor storage device according to a third embodiment will be described with reference to FIG. 24.

The semiconductor storage device according to the third embodiment is configured in basically the same manner as the semiconductor storage device according to the first embodiment. Meanwhile, the semiconductor storage device according to the third embodiment is different from the semiconductor storage device according to the first embodiment in an operation executed after write sequence resumption subsequent to write sequence interruption.

In the semiconductor storage device according to the third embodiment, after a $k^{th}$ verification operation of the write sequence is ended, when the write sequence is interrupted before a $k+1^{th}$ verification operation is ended, a dummy verification operation corresponding to the $k^{th}$ verification operation is executed twice after resumption of the write sequence, and then, the $k+1^{th}$ verification operation and a subsequent operation are executed. FIG. 24 illustrates an example where k=4.

In the example illustrated in FIG. 24, the write sequence and the read operation are basically executed in the same manner as the operations described with reference to FIG. 20.

Figure 24:
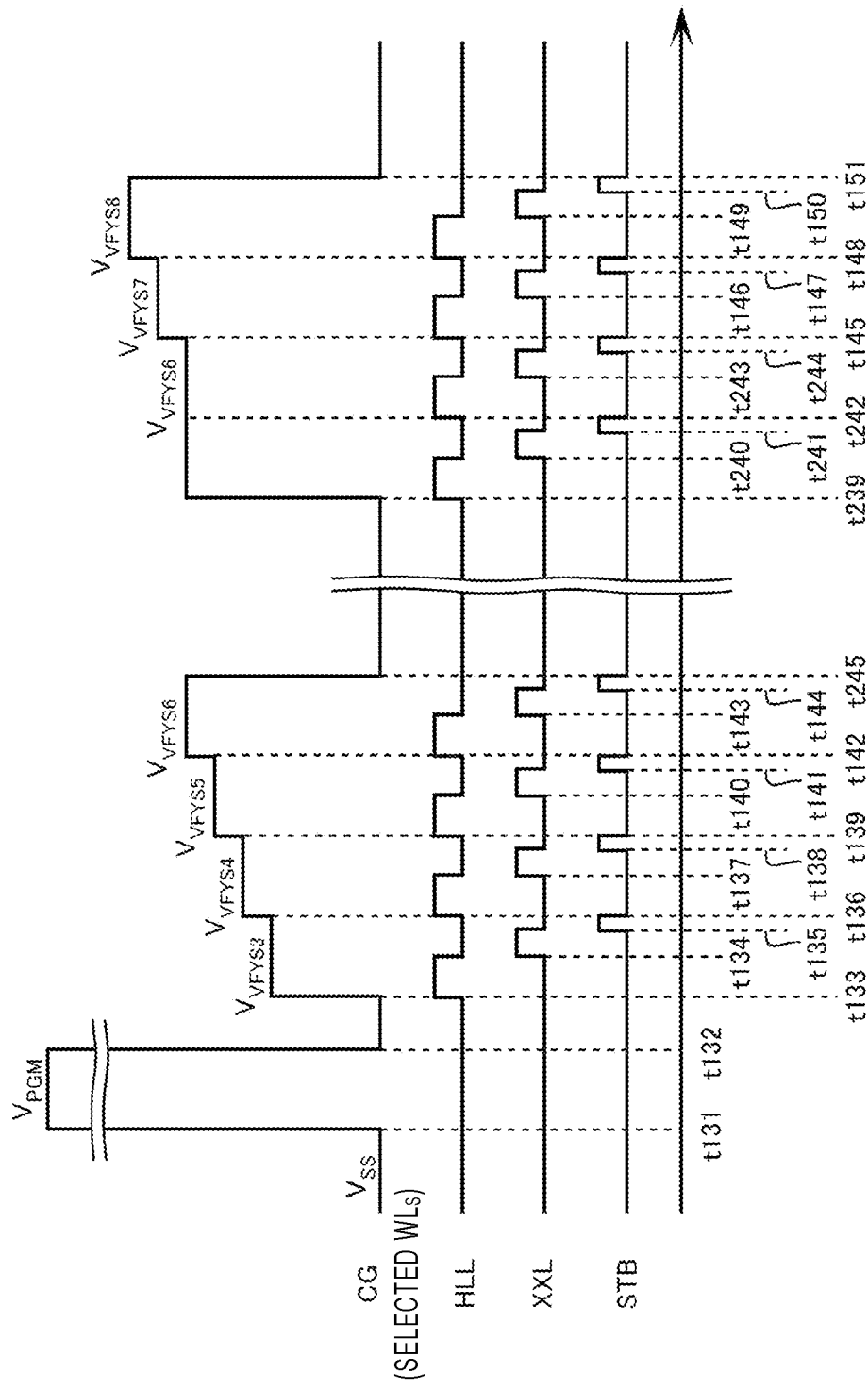
FIG. 24 is a schematic waveform diagram illustrating interruption and resumption of a write sequence according to a third embodiment.

Meanwhile, in the example illustrated in FIG. 24, the write sequence is resumed at the timing t239 instead of the timing t242.

From the timing t239 when the write sequence is resumed, to the timing t145 when the verification operation corresponding to the state S7 is started, a dummy verification operation corresponding to the state S6 is executed twice.

Fourth Embodiment

Next, a semiconductor storage device according to a fourth embodiment will be described with reference to FIG. 25. The semiconductor storage device according to the fourth embodiment is configured in basically the same manner as the semiconductor storage device according to the first embodiment. Meanwhile, the semiconductor storage device according to the fourth embodiment is different from the semiconductor storage device according to the first embodiment in an operation executed after write sequence resumption subsequent to write sequence interruption.

In the semiconductor storage device according to the fourth embodiment, after a $k^{th}$ verification operation of the write sequence is ended, when the write sequence is interrupted before a $k+1^{th}$ verification operation is ended, dummy verification operations corresponding to the $k+1^{th}$ and $k^{th}$ verification operations are sequentially executed after resumption of the write sequence, and then, the $k+1^{th}$ verification operation and a subsequent operation are executed. FIG. 25 illustrates an example where k=4.

In the example illustrated in FIG. 25, the write sequence and the read operation are basically executed in the same manner as the operations described with reference to FIG. 20.

Figure 25:
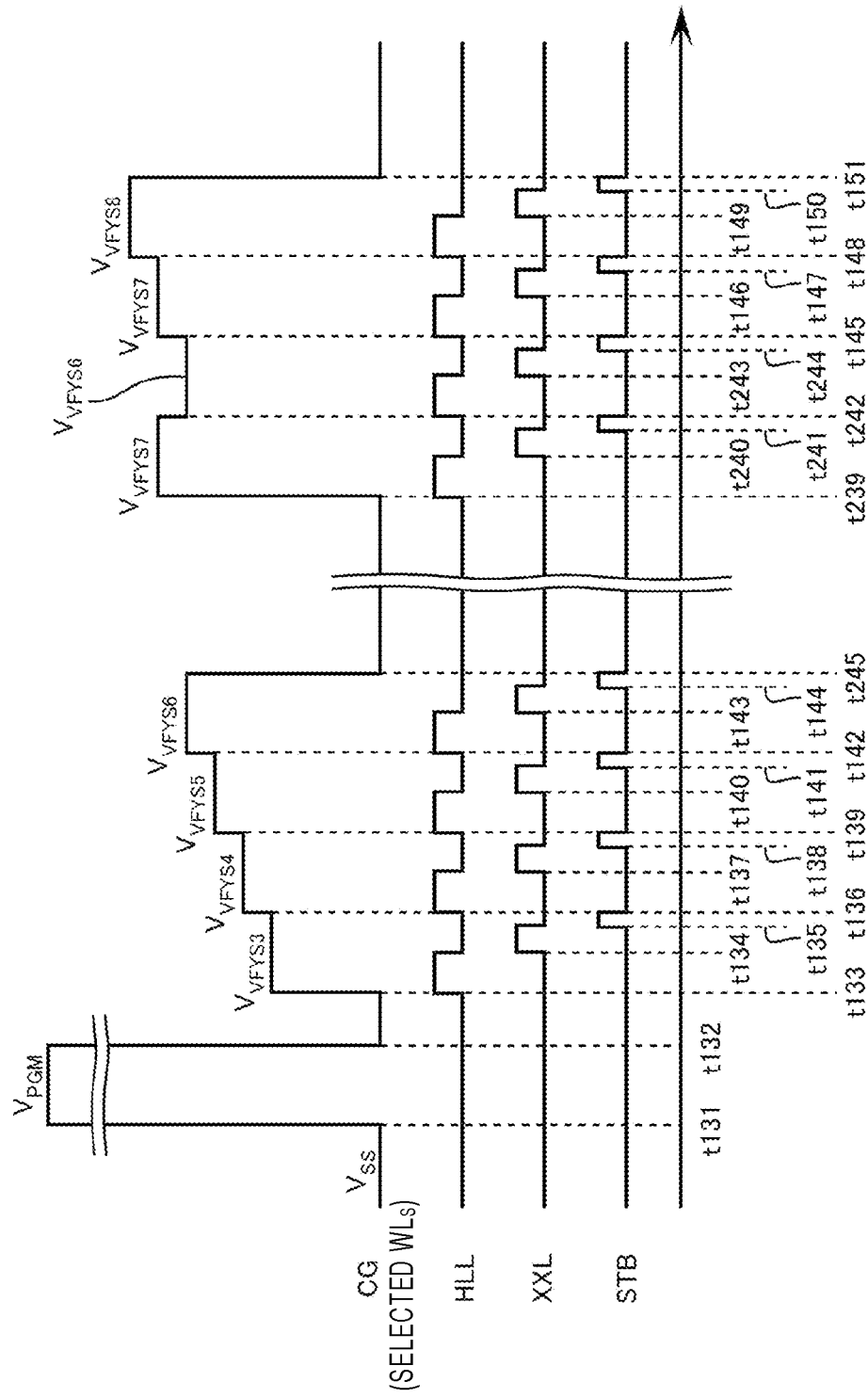
FIG. 25 is a schematic waveform diagram illustrating interruption and resumption of a write sequence according to a fourth embodiment.

Meanwhile, in the example illustrated in FIG. 25, the write sequence is resumed at the timing t239 instead of the timing t242.

From the timing t239 when the write sequence is resumed, to the timing t145 when the verification operation corresponding to the state S7 is started, dummy verification operations corresponding to the states S7 and S6 are sequentially executed.

Fifth Embodiment

Next, a semiconductor storage device according to a fifth embodiment will be described with reference to FIG. 26.

The semiconductor storage device according to the fifth embodiment is configured in basically the same manner as the semiconductor storage device according to the first embodiment. Meanwhile, the semiconductor storage device according to the fifth embodiment is different from the semiconductor storage device according to the first embodiment in an operation executed after write sequence resumption subsequent to write sequence interruption.

In the semiconductor storage device according to the fifth embodiment, after a $k^{th}$ verification operation of the write sequence is ended, when the write sequence is interrupted before a $k+1^{th}$ verification operation is ended, a dummy verification operation corresponding to the $k+1^{th}$ verification operation is executed after resumption of the write sequence, and then, the $k+1^{th}$ verification operation and a subsequent operation are executed. FIG. 26 illustrates an example where k=4.

In the example illustrated in FIG. 26, the write sequence and the read operation are basically executed in the same manner as the operations described with reference to FIG. 20.

Figure 26:
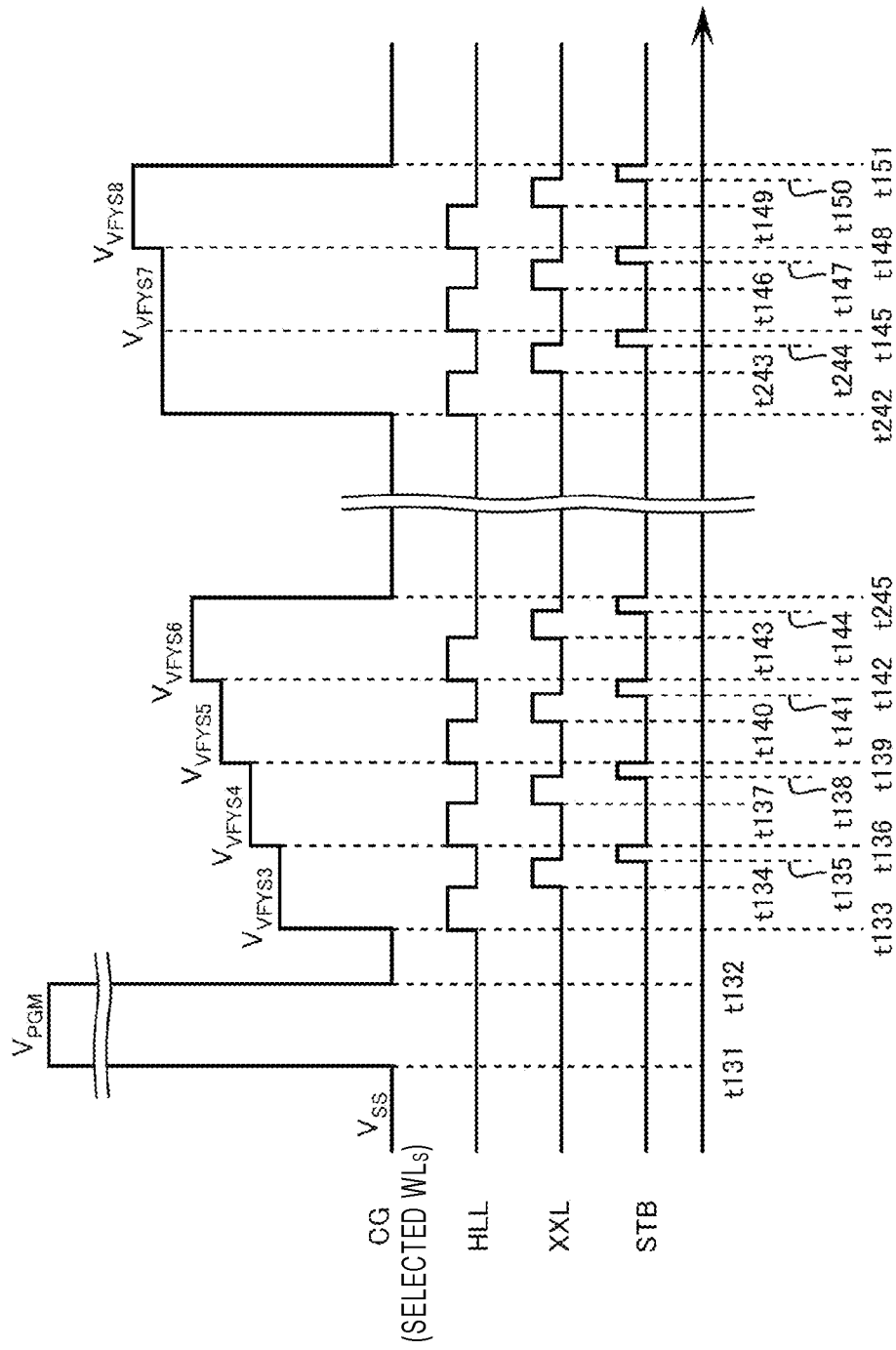
FIG. 26 is a schematic waveform diagram illustrating interruption and resumption of a write sequence according to a fifth embodiment.

Meanwhile, in the example illustrated in FIG. 26, from the timing t242 when the write sequence is resumed, to the timing t145 when the verification operation corresponding to the state S7 is started, a dummy verification operation corresponding to the state S7 is executed.

Sixth Embodiment

Next, a semiconductor storage device according to a sixth embodiment will be described with reference to FIG. 27. The semiconductor storage device according to the sixth embodiment is configured in basically the same manner as the semiconductor storage device according to the first embodiment. Meanwhile, the semiconductor storage device according to the sixth embodiment is different from the semiconductor storage device according to the first embodiment in an operation executed after write sequence resumption subsequent to write sequence interruption.

In the semiconductor storage device according to the sixth embodiment, after a $k^{th}$ verification operation of the write sequence is ended, when the write sequence is interrupted before a $k+1^{th}$ verification operation is ended, a dummy verification operation in which a voltage larger than the verification voltage $V_{VFYS7}$ corresponding to the $k+1^{th}$ verification operation is supplied to the selected word line $WL_S$ is executed after resumption of the write sequence. Then, a dummy verification operation corresponding to the $k+1^{th}$ verification operation is executed, and then, the $k+1^{th}$ verification operation and a subsequent operation are executed. FIG. 27 illustrates an example where k=4.

In the example illustrated in FIG. 27, the write sequence and the read operation are basically executed in the same manner as the operations described with reference to FIG. 20.

Figure 27:
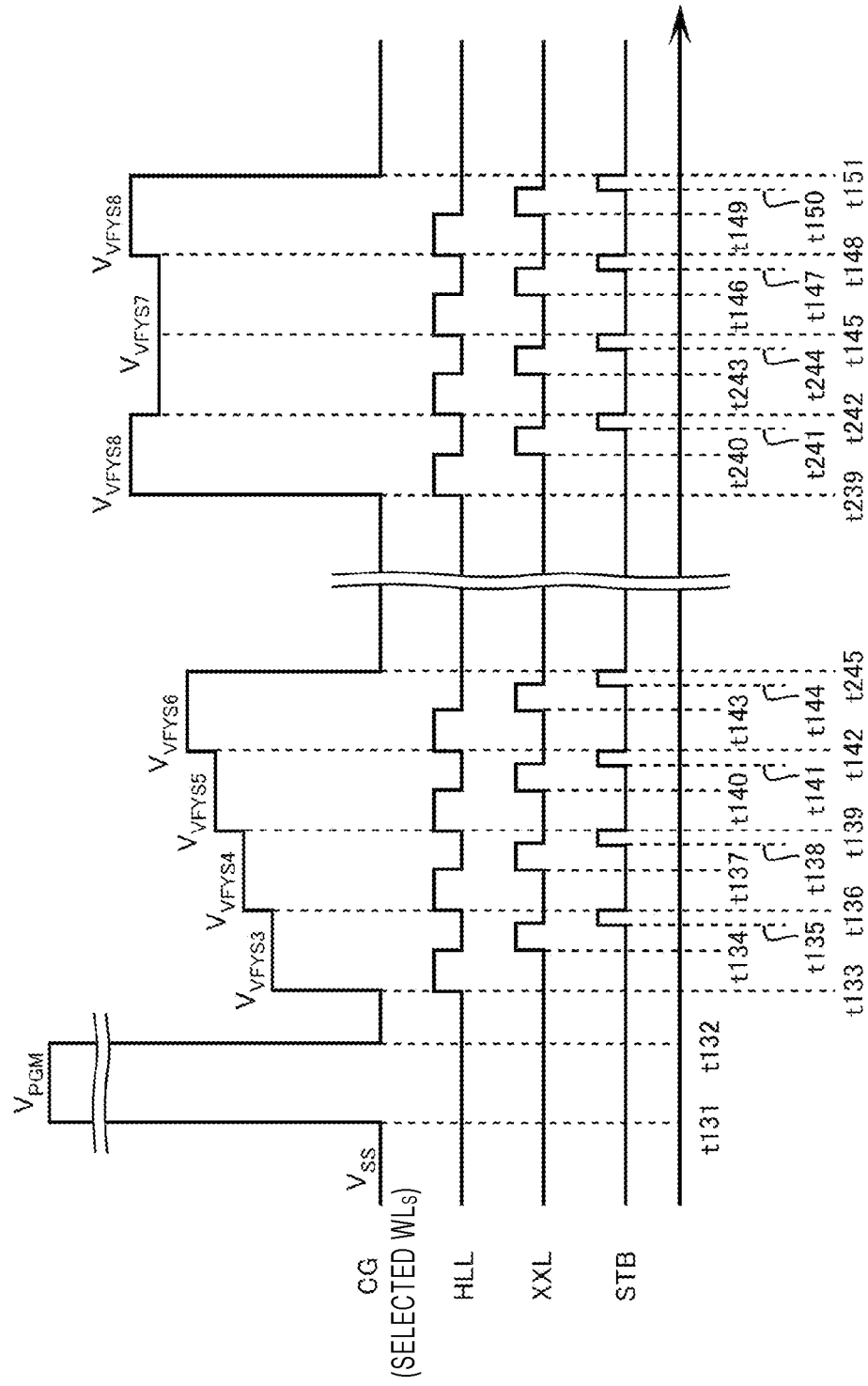
FIG. 27 is a schematic waveform diagram illustrating interruption and resumption of a write sequence according to a sixth embodiment.

Meanwhile, in the example illustrated in FIG. 27, the write sequence is resumed at the timing t239 instead of the timing t242.

From the timing t239 when the write sequence is resumed, to the timing t145 when the verification operation corresponding to the state S7 is started, the above-described two dummy verification operations are sequentially executed. In the example of FIG. 27, from the timing t239 to the timing t242, the verification voltage $V_{VFYS8}$ corresponding to the state S8 is supplied to the selected word line $WL_S$.

Seventh Embodiment

Next, a semiconductor storage device according to a seventh embodiment will be described with reference to FIG. 28. The semiconductor storage device according to the seventh embodiment is configured basically in the same manner as the semiconductor storage device according to the first embodiment. Meanwhile, the semiconductor storage device according to the seventh embodiment is different from the semiconductor storage device according to the first embodiment in an operation executed after write sequence resumption subsequent to write sequence interruption.

In the semiconductor storage device according to the seventh embodiment, after a $k^{th}$ verification operation of the write sequence is ended, when the write sequence is interrupted before a $k+1^{th}$ verification operation is ended, a dummy verification operation in which a voltage larger than the verification voltage $V_{VFYS7}$ corresponding to the $k+1^{th}$ verification operation is supplied to the selected word line $WL_S$ is executed after resumption of the write sequence, and then, the $k+1^{th}$ verification operation and a subsequent operation are executed. FIG. 28 illustrates an example where k=4.

In the example illustrated in FIG. 28, the write sequence and the read operation are basically executed in the same manner as the operations described with reference to FIG. 20.

Figure 28:
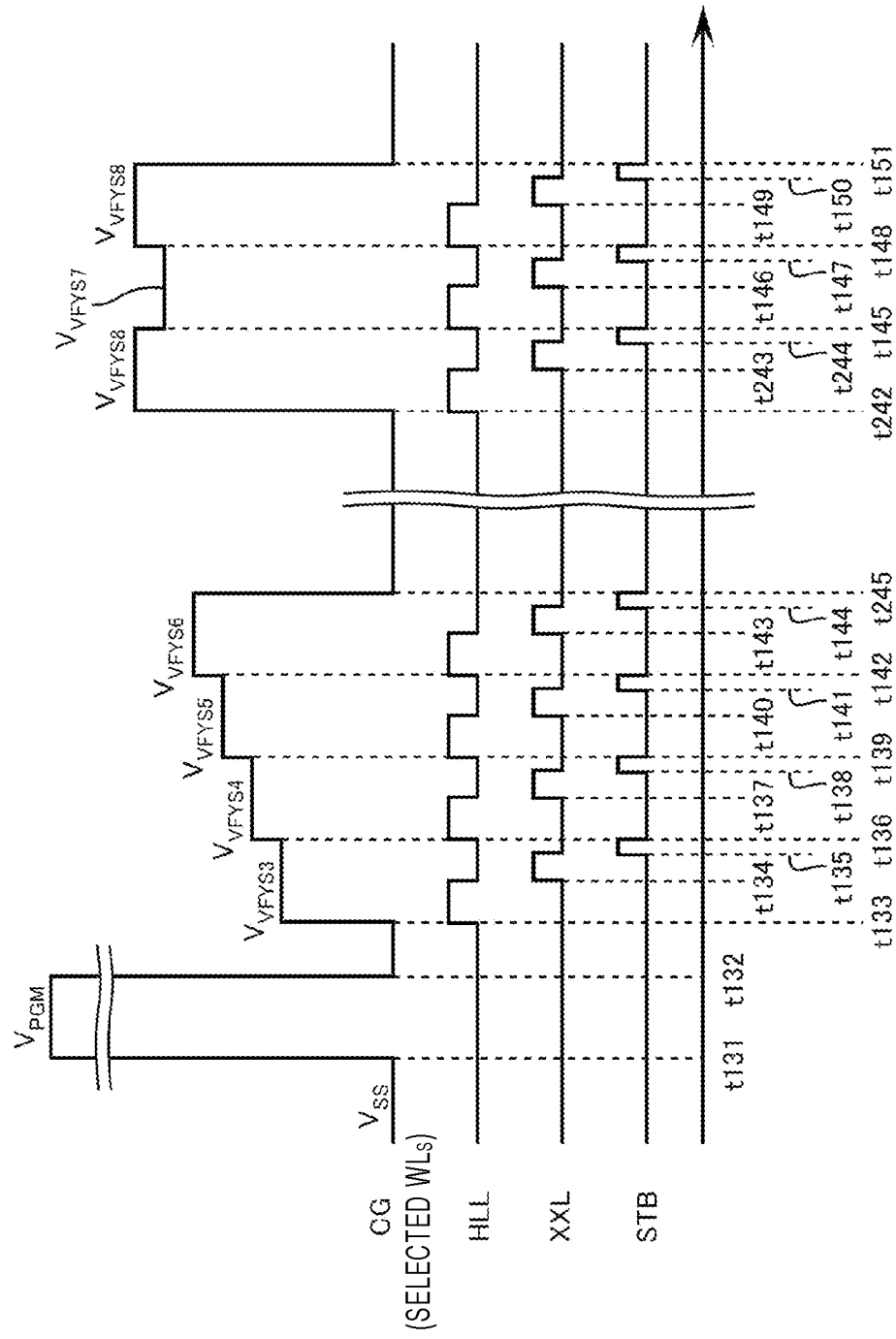
FIG. 28 is a schematic waveform diagram illustrating interruption and resumption of a write sequence according to a seventh embodiment.

Meanwhile, in the example illustrated in FIG. 28, from the timing t242 when the write sequence is resumed, to the timing t145 when the verification operation corresponding to the state S7 is started, the above-described dummy verification operation is executed. In the example of FIG. 28, from the timing t242 to the timing t145, the verification voltage $V_{VFYS8}$ corresponding to the state S8 is supplied to the selected word line $WL_S$.

Eighth Embodiment

Next, a semiconductor storage device according to an eighth embodiment will be described with reference to FIGS. 29 to 31. The semiconductor storage device according to the eighth embodiment is configured basically in the same manner as the semiconductor storage device according to the first embodiment. Meanwhile, the semiconductor storage device according to the eighth embodiment is different from the semiconductor storage device according to the first embodiment in the execution order of the verification operation.

For example, in the first embodiment, as described with reference to FIGS. 17, 19 and the like, when the number of loops nW is 8, the verification operation corresponding to the state S3 is executed from the timing t133 to the timing t136, the verification operation corresponding to the state S4 is executed from the timing t136 to the timing t139, and subsequently similarly, the verification operations corresponding to the states S5, S6, S7, and S8 are sequentially executed from the timing t139 to the timing t151. That is, when the verification operation is executed many times in each write loop, verification operations (from a verification operation corresponding to a low threshold voltage state to a verification operation corresponding to a high threshold voltage state) are sequentially executed.

Figure 29:
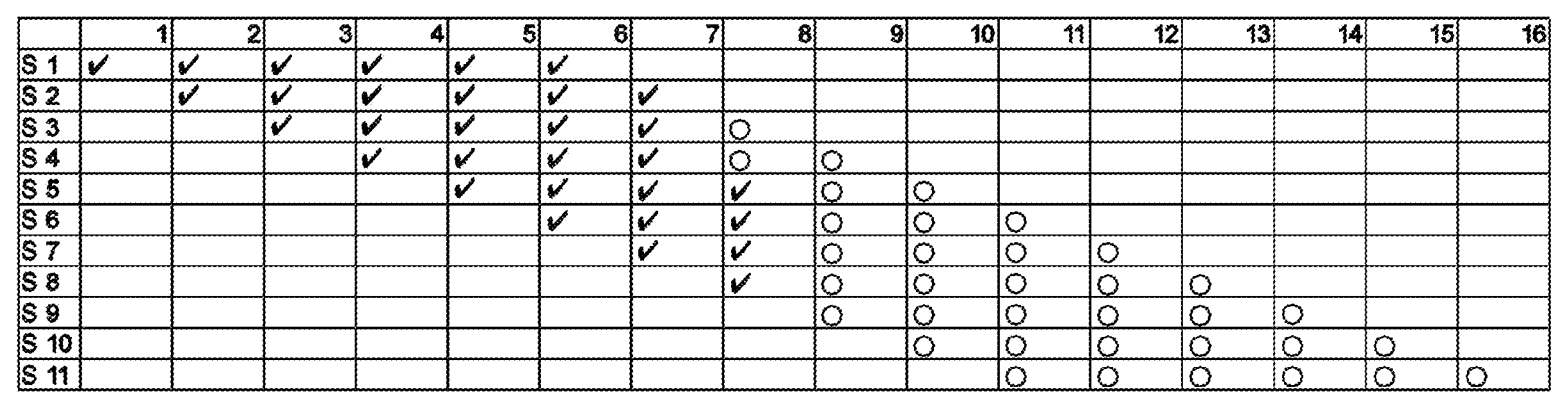
Figure 30:
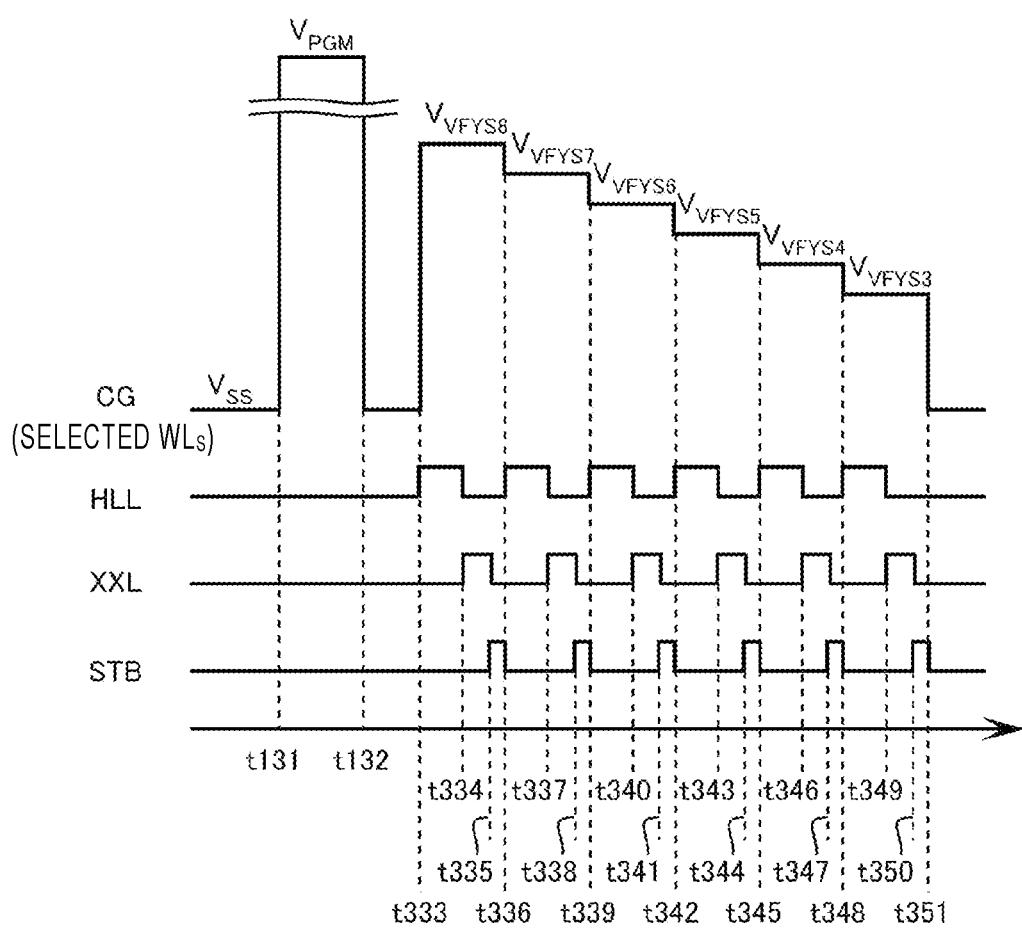
FIG. 30 is a schematic waveform diagram illustrating interruption and resumption of the write sequence according to the eighth embodiment.

Meanwhile, in the eighth embodiment, as illustrated in FIGS. 29 and 30, when the number of loops nW is 8, the verification operation corresponding to the state S8 is executed from the timing t333 to the timing t336, the verification operation corresponding to the state S7 is executed from the timing t336 to the timing t339, and subsequently similarly, the verification operations corresponding to the states S6, S5, S4, and S3 are sequentially executed from the timing t339 to the timing t351. That is, when the verification operation is executed many times in each write loop, verification operations (from a verification operation corresponding to a high threshold voltage state to a verification operation corresponding to a low threshold voltage state) are sequentially executed.

In the eighth embodiment, after a $k^{th}$ verification operation of the write sequence is ended, when the write sequence is interrupted before a $k+1^{th}$ verification operation is ended, in the same manner as in the first embodiment, a dummy verification operation corresponding to the $k^{th}$ verification operation is executed after resumption of the write sequence, and then, the $k+1^{th}$ verification operation and a subsequent operation are executed.

Figure 31:
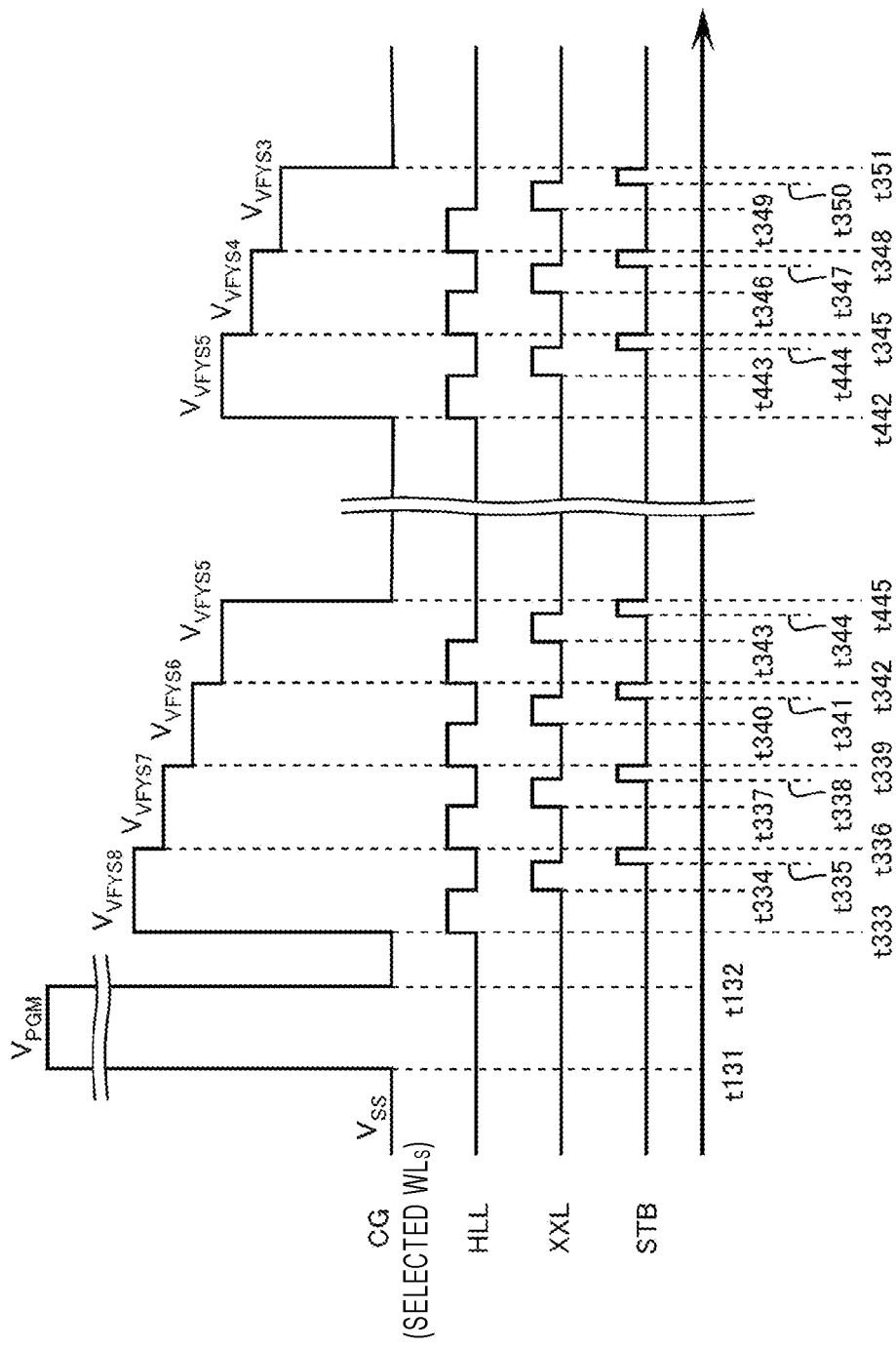
FIG. 31 is a schematic waveform diagram illustrating interruption and resumption of the write sequence according to the eighth embodiment.

In the example illustrated in FIG. 31, from the timing t131 to the timing t344, the write sequence is executed in the same manner as in the example illustrated in FIG. 30.

At the timing t445, the verification operation corresponding to the state S5 is ended, and the write sequence is interrupted. That is, the ground voltage $V_{SS}$ is supplied to the selected word line $WL_S$. The signal lines HLL, XXL, and STB (FIG. 6) enter into states of "L, L, L".

At the timing t442, the write sequence is resumed, and a dummy verification operation corresponding to the state S5 is started. That is, the verification voltage $V_{VFYS5}$ is supplied to the selected word line $WL_S$ to which the ground voltage $V_{SS}$ was supplied. The signal lines HLL, XXL, and STB (FIG. 6) enter into states of "H, L, L".

At the timing t443, the signal lines HLL, XXL, and STB (FIG. 6) enter into states of "L, H, L".

At the timing t444, the signal lines HLL, XXL, and STB (FIG. 6) enter into states of "L, L, H".

Then, the dummy verification operation corresponding to the state S5 is ended, and after the timing t345 in the write sequence, corresponding operations are executed.

In the above-described example, as in the first embodiment, after the $k^{th}$ verification operation of the write sequence is ended, when the write sequence is interrupted before the $k+1^{th}$ verification operation is ended, the dummy verification operation corresponding to the $k^{th}$ verification operation is executed after resumption of the write sequence, and then, the $k+1^{th}$ verification operation and the subsequent operation are executed. However, such a method is merely an example, and specific modes may be changed.

For example, as in the second embodiment (FIG. 23), after the $k^{th}$ verification operation of the write sequence is ended, when the write sequence is interrupted before the $k+1^{th}$ verification operation is ended, dummy verification operations corresponding to $k-1^{th}$ and $k^{th}$ verification operations may be sequentially executed after resumption of the write sequence.

For example, as in the third embodiment (FIG. 24), after the $k^{th}$ verification operation of the write sequence is ended, when the write sequence is interrupted before the $k+1^{th}$ verification operation is ended, a dummy verification operation corresponding to the $k^{th}$ verification operation may be executed twice after resumption of the write sequence.

For example, as in the fourth embodiment (FIG. 25), after the $k^{th}$ verification operation of the write sequence is ended, when the write sequence is interrupted before the $k+1^{th}$ verification operation is ended, dummy verification operations corresponding to the $k+1^{th}$ and $k^{th}$ verification operations may be sequentially executed after resumption of the write sequence.

For example, as in the fifth embodiment (FIG. 26), after the $k^{th}$ verification operation of the write sequence is ended, when the write sequence is interrupted before the $k+1^{th}$ verification operation is ended, a dummy verification operation corresponding to the k+1$^{th}$ verification operation may be executed after resumption of the write sequence.

Other Embodiments

The semiconductor storage devices according to the first embodiment to the eighth embodiment are described above. However, the semiconductor storage devices according to these embodiments are merely examples, and specific configurations and operations, etc., may be changed.

For example, in the first embodiment to the eighth embodiment, after the k$^{th}$ verification operation of the write sequence is ended, when the write sequence is interrupted before the k+1$^{th}$ verification operation is ended, any one of the verification voltages $V_{VFYS1}$ to $V_{VFYS15}$ corresponding to the states S1 to S15 is supplied to the selected word line $WL_S$ before the start of the k+1$^{th}$ verification operation after the resumption of the write sequence. However, such a method is merely an example, and specific methods may be changed. For example, it is possible to consider that the voltage supplied to the selected word line $WL_S$ at such a timing is set as a voltage equal to or higher than the verification voltage corresponding to the first verification operation. For example, it may be thought that when the voltage supplied to the selected word line $WL_S$ at such a timing is set as a voltage equal to or higher than the verification voltage corresponding to the k$^{th}$ verification operation, the voltage of the selected word line $WL_S$ is more easily adjustable. It is possible to consider that the voltage supplied to the selected word line $WL_S$ at such a timing is set as at least a voltage smaller than the program voltage $V_{PGM}$.

For example, in the examples described for the first embodiment to the eighth embodiment, the execution time of the verification operation is the same as the execution time of the dummy verification operation, and the number of dummy verification operations executed after resumption of the write sequence is smaller than that in the first comparative example (FIG. 21). However, such a mode is merely an example, and specific modes may be changed. For example, the execution time of the dummy verification operation may be shorter than the execution time of the verification operation. Accordingly, it is possible to further speed up the write sequence.

For example, as described above, during the dummy verification operation, a voltage may be or may not be supplied to a bit line BL. When a voltage is supplied to a bit line BL, it is possible to change the bit line BL to which the voltage is to be supplied. For example, in the above-described example, with respect to the memory cell MC that is determined to have reached the target threshold voltage at the verification operation, data within the plurality of latch circuits DL within the sense amplifier unit SAU corresponding to the memory cell MC is updated to a value indicating write protection. In such a case, it may be thought that the number of bit lines BL to which the voltage is supplied during the dummy verification operation is smaller than the number of bit lines BL to which the voltage is supplied during the verification operation.

However, such a mode is merely an example, and specific methods may be changed. For example, with respect to the memory cell MC that is determined to have reached the target threshold voltage during the verification operation, a verification pass flag may be separately latched within the sense amplifier unit SAU corresponding to the memory cell MC, so that 4-bit data corresponding to the memory cell MC may be maintained. The number of bit lines BL to which the voltage is supplied during the dummy verification operation may be set as the same as the number of bit lines BL to which the voltage is supplied during the verification operation.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of performing a write in a semiconductor storage device, said method comprising:
  programming a memory transistor of the semiconductor storage device;
  executing a plurality of verification operations in sequence after programming the memory transistor, the verification operations including a first verification operation, a second verification operation that completes execution after the first verification operation, a third verification operation that completes execution after the second verification operation, and a fourth verification operation that completes execution after the third verification operation, wherein during the first, second, third, and fourth verification operations, voltages of first, second, third, and fourth levels are applied to a word line that is electrically connected to the memory transistor, respectively; and
  upon receipt of a command to resume a write sequence that was interrupted before the fourth verification operation completed, prior to re-executing the fourth verification operation, executing at least one but no more than two verifications operations.

2. The method of claim 1, wherein the third verification operation is re-executed prior to re-executing the fourth verification operation.

3. The method of claim 1, wherein the second verification operation is re-executed and then the third verification operation is re-executed, prior to re-executing the fourth verification operation.

4. The method of claim 1, wherein the third verification operation is re-executed and then the second verification operation is re-executed, prior to re-executing the fourth verification operation.

5. The method of claim 1, wherein the third verification operation is re-executed twice prior to re-executing the fourth verification operation.

6. The method of claim 1, wherein a dummy fourth verification operation is executed prior to re-executing the fourth verification operation.

7. The method of claim 1, wherein
  the verification operations include a fifth verification operation during which a voltage of a fifth level that is higher than any of the first, second, third, and fourth levels, is applied to the word line, and
  a dummy fifth verification operation is executed and then a dummy fourth verification operation is executed, prior to re-executing the fourth verification operation.

8. The method of claim 1, wherein
  the verification operations include a fifth verification operation during which a voltage of a fifth level that is higher than any of the first, second, third, and fourth levels, is applied to the word line, and a dummy fifth verification operation is executed prior to re-executing the fourth verification operation.

9. The method of claim 1, wherein the first level is lower than the second level, which is lower than the third level, which is lower than the fourth level.

10. The method of claim 1, wherein the first level is higher than the second level, which is higher than the third level, which is higher than the fourth level.

11. A method of performing a write in a semiconductor storage device, said method comprising:
   programming a memory transistor of the semiconductor storage device;
   executing a plurality of verification operations in sequence after programming the memory transistor, the verification operations including a first verification operation, a second verification operation that completes execution after the first verification operation, and a third verification operation that starts execution after the second verification operation; and
   upon receipt of a command to resume a write sequence that was interrupted before the third verification operation completed, executing at least one dummy verification operation and then executing the third verification operation.

12. The method of claim 11, wherein
   during each of the first, second, and third verification operations, data indicating whether or not the memory transistor is ON or OFF is latched, and
   during each dummy verification operation, data indicating whether or not the memory transistor is ON or OFF is not latched.

13. The method of claim 11, wherein
   upon receipt of the command to resume a write sequence that was interrupted before the third verification operation completed, executing at least two dummy verification operations and then executing the third verification operation.

14. The method of claim 13, wherein
   during the first, second, and third verification operations, voltages of first, second, and third levels are applied to a word line that is electrically connected to the memory transistor, respectively; and
   during the at least two dummy verification operations, voltages of different levels are applied to the word line.

15. The method of claim 13, wherein
   during the first, second, and third verification operations, voltages of first, second, and third levels are applied to a word line that is electrically connected to the memory transistor, respectively; and
   during the at least two dummy verification operations, voltages of the same level are applied to the word line.

* * * * *